United States Patent
Yoo et al.

(10) Patent No.: US 8,331,144 B2
(45) Date of Patent: Dec. 11, 2012

(54) NON-VOLATILE MEMORY DEVICE AND PROGRAM METHOD THEREOF

(75) Inventors: Han Woong Yoo, Gyeonggi-do (KR); Seung-Hwan Song, Gyeonggi-do (KR); Junjin Kong, Gyeonggi-do (KR); Heeseok Eun, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 336 days.

(21) Appl. No.: 12/575,735

(22) Filed: Oct. 8, 2009

(65) Prior Publication Data

US 2010/0142281 A1 Jun. 10, 2010

(30) Foreign Application Priority Data

Dec. 8, 2008 (KR) ........................ 10-2008-0124051

(51) Int. Cl.
*G11C 11/34* (2006.01)
(52) U.S. Cl. .............................. 365/185.03; 365/185.02
(58) Field of Classification Search ............. 365/185.02, 365/185.18, 185.22, 185.24, 185.03
See application file for complete search history.

(56) References Cited

U.S. PATENT DOCUMENTS

| 6,996,004 | B1 | 2/2006 | Fastow et al. | |
|---|---|---|---|---|
| 7,230,851 | B2 | 6/2007 | Fong et al. | |
| 7,656,713 | B2 * | 2/2010 | Cernea | 365/185.22 |
| 7,864,575 | B2 * | 1/2011 | Aritome | 365/185.03 |
| 2003/0002348 | A1 * | 1/2003 | Chen et al. | 365/189.01 |
| 2006/0193169 | A1 * | 8/2006 | Nazarian | 365/185.03 |
| 2006/0193176 | A1 * | 8/2006 | Li | 365/185.17 |
| 2006/0203544 | A1 * | 9/2006 | Visconti et al. | 365/185.02 |
| 2008/0137436 | A1 * | 6/2008 | Salter et al. | 365/185.24 |
| 2008/0205148 | A1 * | 8/2008 | Kanda | 365/185.17 |

FOREIGN PATENT DOCUMENTS

| KR | 1020030020950 A | 3/2003 |
|---|---|---|
| KR | 1020080022394 A | 3/2008 |
| KR | 1020090035988 A | 4/2009 |

* cited by examiner

*Primary Examiner* — Douglas King

(74) *Attorney, Agent, or Firm* — Myers Bigel Sibley & Sajovec, P.A.

(57) ABSTRACT

Disclosed is a program method of a non-volatile memory device which comprises classifying plural memory cells into aggressor cells and victim cells based on program data to be written in the plural memory cells; and programming the aggressor cells by a program manner different from the victim cells.

6 Claims, 18 Drawing Sheets

Fig. 6A 2nd page
Fig. 6B 3-1 page
Fig. 6C 3-2 page

Fig. 11A 2nd page
Fig. 11B 3-1 page
Fig. 11C 3-2 page

Fig. 13A 2nd page
Fig. 13B 3-1 page
Fig. 13C 3-2 page
Fig. 13D 3-3 page

NON-VOLATILE MEMORY DEVICE AND PROGRAM METHOD THEREOF

REFERENCE TO PRIORITY APPLICATION

This patent application claims priority to Korean Patent Application No. 10-2008-0124051, filed Dec. 8, 2008, the contents of which are hereby incorporated by reference.

FIELD

The present invention relates to a semiconductor memory device and, more particularly, to non-volatile memory devices and program methods thereof.

BACKGROUND

Semiconductor memory devices are roughly classified into volatile semiconductor memory devices and non-volatile semiconductor memory devices. The volatile semiconductor memory devices are capable of reading and writing data rapidly, but lose stored contents at power-off. On the other hand, the non-volatile semiconductor memory devices retain stored contents even at power-off. For this reason, the non-volatile semiconductor memory devices have been used to store contents which have to be retained regardless of whether a power is supplied.

Among the non-volatile semiconductor memory devices, a flash memory device has such a function that cells are electrically erased at the same time. This enables the flash memory device to be widely used to applications such as a computer, a memory card, and the like. The flash memory device is divided into a NOR type and a NAND type according to interconnection between a bit line and cells. A NOR-type flash memory device has such an array structure that two or more cell transistors are connected in parallel with one bit line. The NOR-type flash memory device is configured to program data in a Channel Hot Electron (CHE) manner and to erase data in a Flowler-Nordheim (F-N) tunneling manner. A NAND-type flash memory device has such an array structure that two or more cell transistors are connected in series with one bit line, and is configured to program and erase data in the F-N tunneling manner.

Memory cells of the flash memory device may store 1-bit data or multi-bit data, respectively. In the event that one memory cell stores 1-bit data, it may have a threshold voltage corresponding to one of two threshold voltage states, that is, data '1' and data '0'. On the other hand, if one memory cell stores 2-bit data, it may have a threshold voltage corresponding to one of four threshold voltage states. Further, if one memory cell stores 3-bit data, it may have a threshold voltage corresponding to one of eight threshold voltage states.

In recent, there are sprightly researched various techniques for storing four or more data bits in one memory cell.

SUMMARY

Exemplary embodiments are directed to provide a non-volatile memory device and program method capable of offering high data reliability.

One aspect of exemplary embodiments of the present invention is directed to a program method of a non-volatile memory device, which comprises classifying plural memory cells into aggressor cells and victim cells based on program data to be written in the plural memory cells; and programming the aggressor cells by a program manner different from the victim cells.

Another aspect of exemplary embodiments of the present invention is directed to a program method of a non-volatile memory device, which comprises classifying plural memory cells into aggressor cells and victim cells based on program data to be written in the plural memory; programming the victim cells; and programming the aggressor cells, wherein a verification voltage for programming the victim cells is identical to or lower than a verification voltage corresponding to a target state of each victim cell.

Still another aspect of exemplary embodiments of the present invention is directed to a program method of a non-volatile memory device, which comprises classifying plural memory cells into aggressor cells and victim cells based on program data to be written in the plural memory; programming the aggressor cells to a dummy state; and programming the aggressor cells and the victim cells to target states, respectively, wherein the dummy state corresponds to a threshold voltage lower than a target state of the aggressor cells.

Still another aspect of exemplary embodiments of the present invention is directed to a program method of a non-volatile memory device, which comprises classifying plural memory cells into aggressor cells and victim cells based on program data to be written in the plural memory cells; programming the plural memory cells, wherein a program loop for the aggressor cells commences prior to a program loop for the victim cells.

Still another aspect of exemplary embodiments of the present invention is directed to a non-volatile memory device which comprises a cell array including plural memory cells; a page buffer connected with a bit line of each of the plural memory cells; a voltage generator configured to supply a word line voltage to a word line of the plural memory cells; and control logic configured to control the page buffer and the voltage generator such that the plural memory cells are classified into aggressor cells and victim cells based on program data to be written in the plural memory cells and physical influence mutually inflicted between the plural memory cells and such that the aggressor cells are programmed according to a program operation different from the victim cells.

DETAILED DESCRIPTION OF THE EMBODIMENTS

Below, the present invention will be described with reference to a NAND-type flash memory device as a non-volatile memory device. But, different advantages and performance of the present invention can be easily understood according to this disclosure. A term such as distribution is used to indicate the number of memory cells, corresponding to a threshold voltage, among memory cells in a specific unit (for example, a page, a block, a chip, etc.). For easy of description, it is assumed that memory cells in a page are classified using terms such as an aggressor cell, a victim cell, and a non-victim cell. The aggressor cell means a memory cell which gives rise to large physical influence (for example, coupling effect) on cells in the same or adjacent page. The victim cell is used to indicate a memory cell which is remarkably physically affected by the aggressor cell. The non-victim cell is a memory cell which does not affect memory cells in the same or adjacent page or is not affected thereby. The victim and non-victim cells are referred to as rest cells. In practice, terms such as the aggressor cell and the victim cell are used by a relative concept. The non-victim cell is not free from the physical influence although there is a few difference. Further, all cells may become not only the aggressor cell but also the victim cell or the non-victim cell according to a point of view. A standard used for classification into the aggressor, victim, and non-victim cells may be changed or adjusted according to operating conditions of a memory device, program methods and sequences of a memory device, circumstance variation, intention of a user, and so fourth. Below, exemplary embodiments of the present invention will be more fully described with reference to accompanying drawings.

Figure 1:
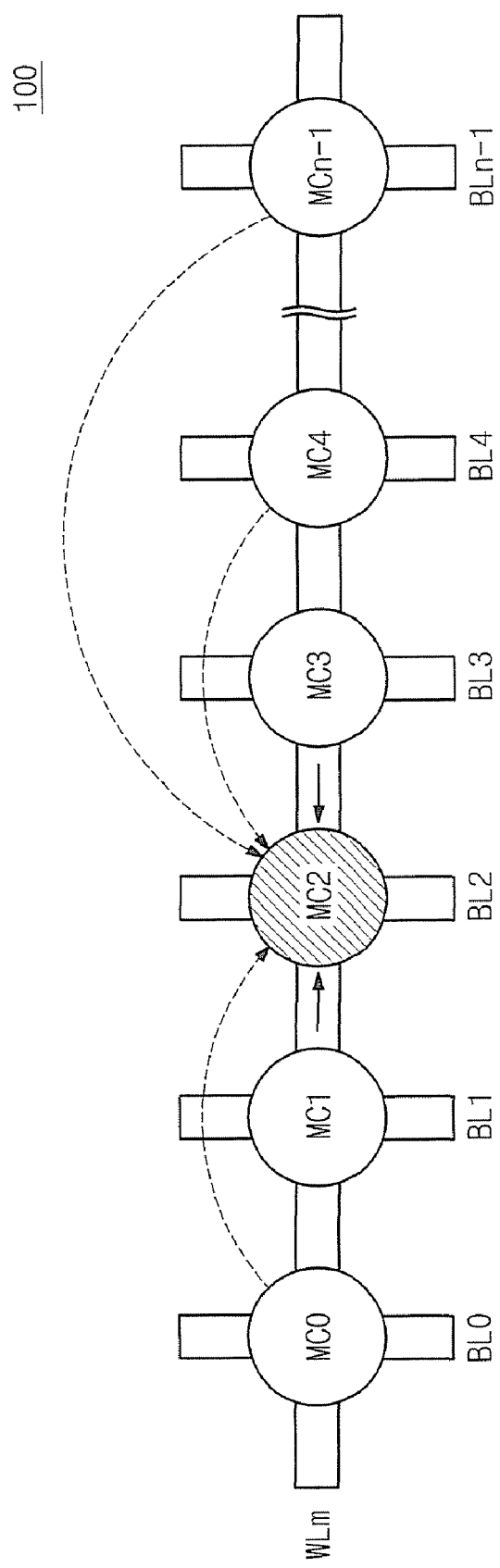
FIG. 1 is a diagram showing a non-volatile memory cell array according to the present invention.

FIG. 1 is a diagram showing a cell array 100 of a non-volatile memory device. Referring to FIG. 1, a memory cell may be affected physically by adjacent or peripheral memory cells at a program operation. In particular, a memory cell MC2 may be affected unintentionally by memory cells MC0, MC1, and MC3 to MCn−1 which are connected with the same word line WLm as the memory cell MC2 and are programmed at the same time. For example, the floating gate coupling effect caused in a row direction may be described as an example. Hereinafter, an affecting memory cell (for example, MC0, MC1, MC3 to MCn−1) is referred to as an aggressor cell, and an affected memory cell (for example, MC2) is referred to as a victim cell. The aggressor cell and the victim cell are relative. That is, any memory cell may be classified into an aggressor cell or a victim cell based on both a target state where the any memory cell is programmed and a target state where adjacent memory cells are programmed.

The coupling effect may be a representative phenomenon which forces a threshold voltage of a victim cell to be shifted unintentionally. A threshold voltage of the memory cell MC2 may be shifted from an originally programmed threshold voltage.

Unintentional shifting of a threshold voltage will be described using the coupling effect as an example. But, further to the coupling effect, threshold voltages of memory cells may be shifted due to various factors. For example, threshold voltages of memory cells may be changed (for example, lowered) due to time lapse, Hot Temperature Stress (HTS), deterioration of an oxide film according to increase in Program/Erase cycles, and the like. The threshold voltage of the memory cell MC2 may be shifted in the upper direction due to program disturbance at programming of peripheral cells. There may be considered variation in the threshold voltage of the victim cell MC2 according to charge loss of adjacent aggressor cells MC1 and MC3. The charge loss may be caused due to physical influence which aggressor cells inflict to the victim cell.

Threshold voltages of memory cells may be shifted due to the above-described various factors. Thus, the read margin may be reduced due to the above-described shifting of threshold voltages. This forces two adjacent threshold voltage distributions to lap. In this case, read data may include plural erroneous bits. In accordance with the program scheme of the present invention, it is possible to minimize the physical influence between memory cells where one page of data is programmed.

Figure 2:
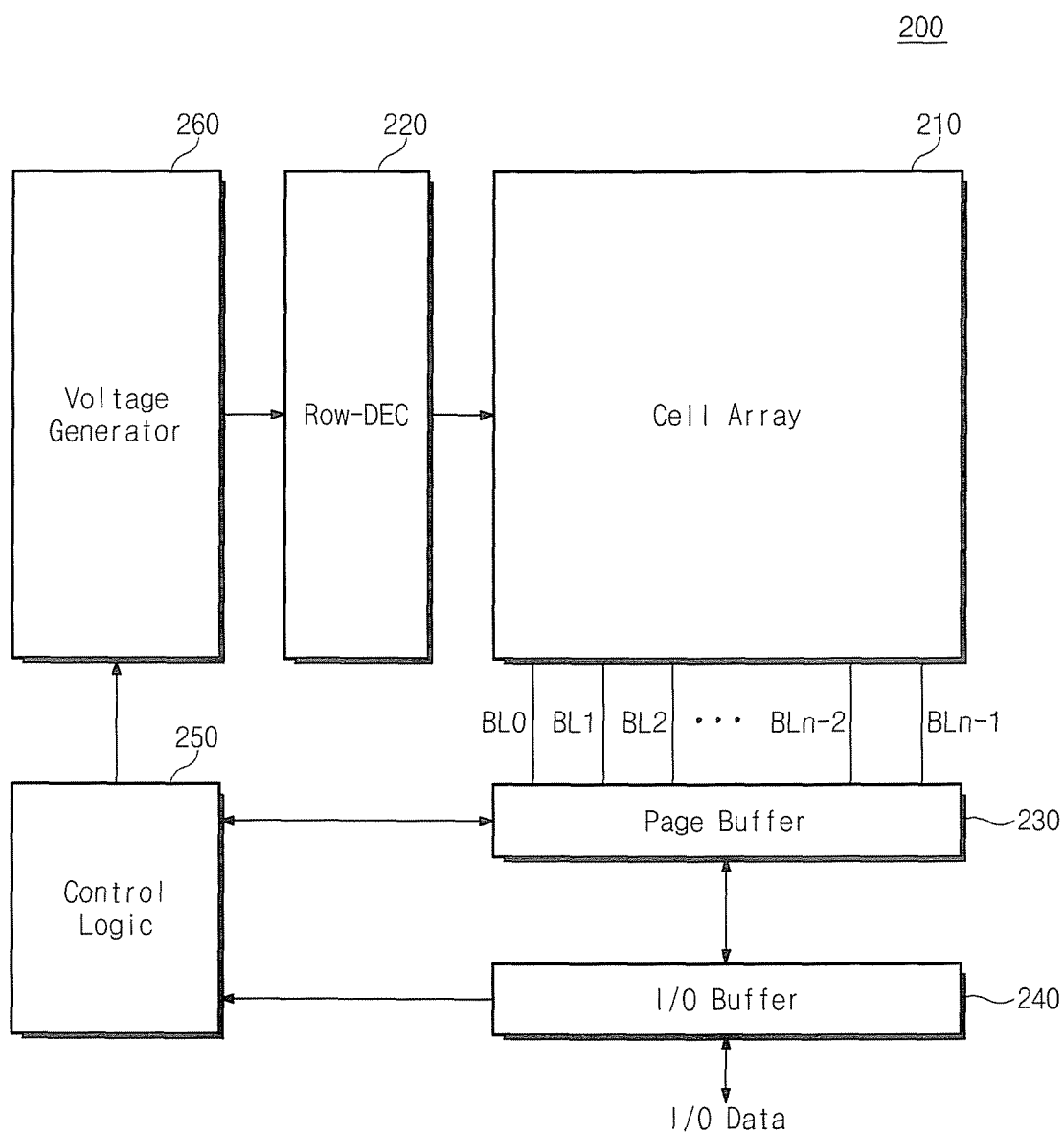
FIG. 2 is a block diagram showing a non-volatile memory device according to the present invention.

FIG. 2 is a block diagram showing a non-volatile memory device 200 according to the present invention. Referring to FIG. 2, when one page of data is programmed, a non-volatile memory device 200 according to the present invention may perform a program operation based on a process for classifying memory cells into aggressor and victim cells and reducing the influence on the aggressor cell. This operation will be accomplished by control logic 250 and a page buffer 230. This will be more fully described below.

A cell array 210 includes memory cells connected to word lines and bit lines. In particular, a multi-level cell (MLC) may be programmed to any one of plural threshold voltage distributions to store plural bits in one cell. The multi-level cell may be programmed densely so as to include the number of threshold voltage states ($2^k$) which are determined according to the number of bits (k) stored within a limited threshold voltage window. Thus, the read margin of the multi-level cell has to be reduced as compared with that of a single-level cell (SLC). In the event that one page of data is programmed, memory cells in the same word line are affected mutually. As the degree of integration increases, there is urgently needed a technique for interrupting the physical influence which is caused between memory cells in the cell array 210.

A row decoder 220 selects word lines in response to a row address. The row decoder 220 transfers word line voltages from a voltage generator 260 to the selected word line. At a program operation, a program voltage Vpgm (for example, about 15V to 20V) and a verification voltage Vvfy are applied to a selected word line, and a pass voltage Vpass is supplied to unselected word lines. At a read operation, the row decoder 220 supplies a voltage Vrd from the voltage generator 260 to the selected word line and a voltage Vread (for example, about 5V) from the voltage generator 260 to the unselected word lines.

The page buffer 230 operates as a write driver or a sense amplifier according to a mode of operation. For example, the page buffer 230 operates as a sense amplifier at a read operation and as a write driver at a program operation. Data may be loaded on the page buffer 230 by a page unit at a program operation. That is, the page buffer 230 receives data to be programmed from an input/output buffer 240 and stores the received data in latches thereof. In order to program multi-bit data, the page buffer 230 is configured to read lower page data, previously programmed, from selected memory cells and to store the read lower page data. An operation of reading previously programmed pages via the page buffer 230 is referred to as an initial read operation, and data read via the initial read operation is referred to as initially read data.

After storing the initially read data in a plurality of latches, target states may be determined by program data and the initially read data. At an operation where the loaded data is programmed, the page buffer 230 supplies a ground voltage (for example, 0V) to bit lines of memory cells to be programmed and a pre-charge voltage (for example, Vcc) to bit lines of memory cell to be program-inhibited.

The input/output buffer 240 is configured to latch (or, temporarily store) an address, a command, or program data received via input/output pins. In the input/output buffer 240, the latched address is provided to an address buffer (not shown), the latched program data to the page buffer 230, and the latched command to a command register (not shown). At a read operation, data read by the page buffer 230 may be output to the external via the input/output buffer 240.

At a program operation, the control logic 250 is configured to classify selected memory cells into aggressor and victim cells based on both loaded data (that is, program data) and initially read data in the page buffer 230. In accordance with classification into the aggressor and victim cells, the control logic 250 controls a program sequence where memory cells each corresponding to the aggressor cells are firstly programmed. This enables the coupling effect between memory cells in the same page to be reduced. Alternatively, at a program operation, the control logic 250 controls the voltage generator 260 so as to predict the physical influence (for example, the coupling effect) of the victim cells due to the aggressor cells and to provide a verification voltage of the victim cells so as to compensate the predicted physical influence. The control logic 250 is configured to determine a verification voltage based on program data loaded on the page buffer 230. As understood from the above description, the control logic 250 is configured to control a program sequence of aggressor and victim cells. The control logic 250 controls the voltage generator 260 to vary a verification voltage according to a target state. Verification voltages for the victim cells or the aggressor cells may be determined based on target states of adjacent memory cells and own target states.

The voltage generator 260 is configured to generate a direct current (DC) voltage according to the control of the control logic 250. The voltage generator 260 responds to the control of the control logic 250 to provide overall DC voltages for programming of the non-volatile memory device 200. In particular, the voltage generator 260 may provide various verification voltages under the control of the control logic 250.

In accordance with an exemplary embodiment, the non-volatile memory device 200 minimizes the coupling effect or the physical influence caused between memory cells in one page.

Figure 3:
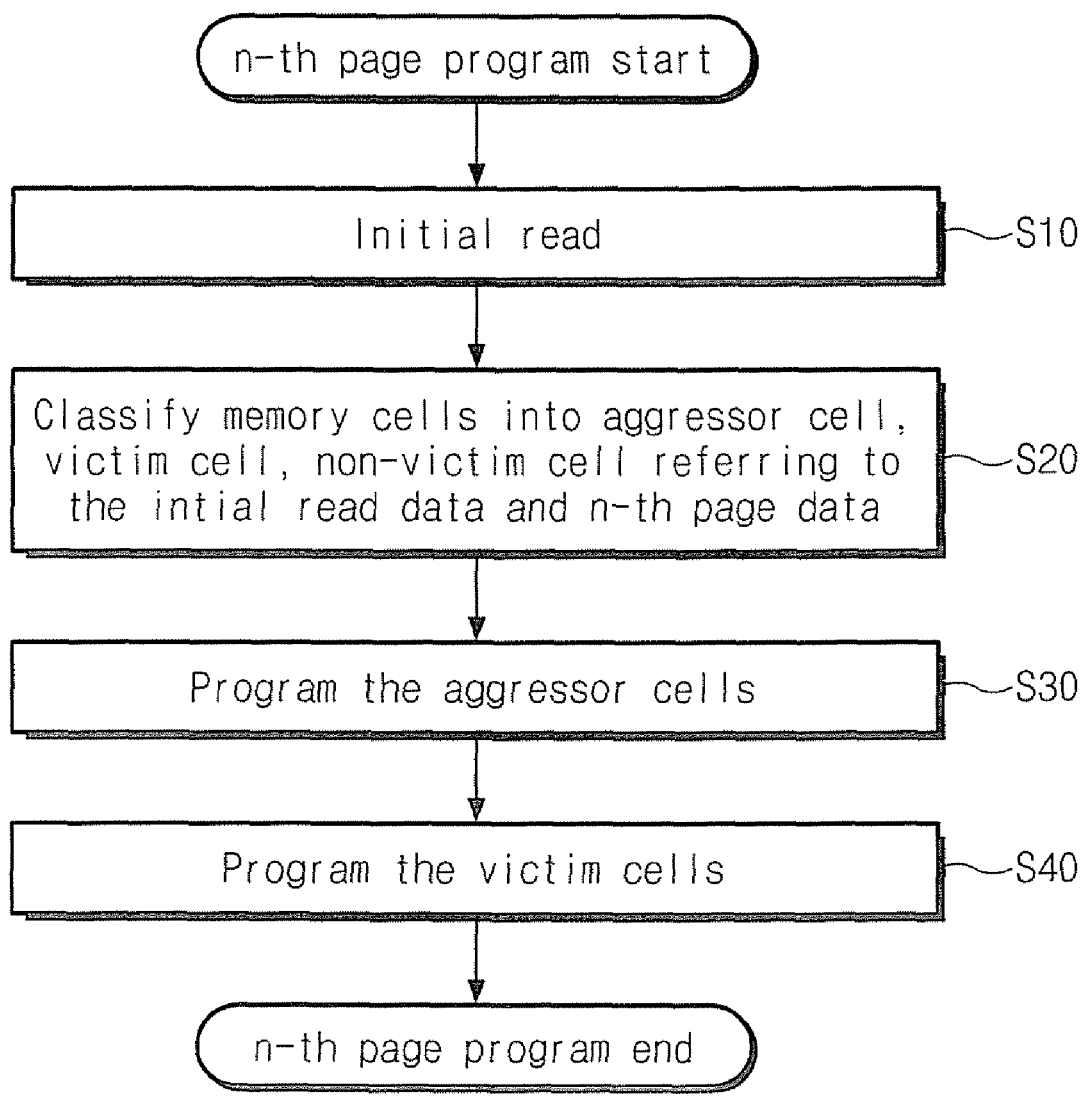
FIG. 3 is a flowchart showing a program process according one embodiment of the present invention.

FIG. 3 is a flowchart showing a program process of an nth page according to the control of control logic 250 in FIG. 2. Referring to FIG. 3, memory cells to be programmed by one page data may be classified into victim cells and aggressor cells. Then, a program process may commence with respect to the classified cells.

If loading of program data on a page buffer 230 is completed, programming of an nth page may commence. In step S10, the page buffer 230 executes an initial read operation where previously programmed data of the nth page is sensed via bit lines of selected memory cells of a cell array 210. If a page to be programmed is the third page, data of the second and third pages may be stored in latches of the page buffer 230 according to the initial read operation.

If the initial read operation is completed, in step S20, control logic 250 classifies into aggressor and victim cells memory cells to be programmed by the nth page data, based on data latched by the initial read operation. The above-described classification process differentiates according to a program process. Herein, it is assumed that memory cells with threshold voltages largely varied by programming are memory cells to be programmed to a program state. In this case, memory cells adjacent to such memory cells may experience the most coupling effect. The control logic 250 classifies a memory cell to be programmed to a program state from an erase state into an aggressor cell and a memory cell adjacent to the aggressor cell into a victim cell. In the event that memory cells placed at both sides of the victim cell all are memory cells to be programmed to a program state from an erase state, the victim cell may undergo the most coupling effect. The control logic 250 is able to classify the above-described coupling effect per size by comparing the nth page data to be programmed with the initially read data. The control logic 250 makes classification into the aggressor and victim cells according to the coupling effect.

In step S30, the control logic 250 sorts memory cells, each corresponding to the aggressor cell, among the selected memory cells and controls a voltage generator 260 and the page buffer 230 such that the sorted memory cells are firstly programmed to a target state, respectively.

If programming of the aggressor cells is completed, in step S40, programming of victim cells may commence. In the event that the programming of the victim cells is completed, a program process for the nth page is ended.

The physical influence on the victim cells may be compensated by firstly programming aggressor cells inflicting the large physical influence on the victim cells. That is, if threshold voltages of the victim cells are shifted according to the physical influence caused by the aggressor cells, such shifting may be compensated at subsequent programming of the victim cells. Thus, it is possible to effectively compensate the physical influence between selected memory cells in which one page data is programmed. Herein, the aggressor cells may be selected according to various standards. That is, selection of the victim cells may differentiate according to a program scheme which is executed in the non-volatile memory device. Standards used for classification into aggressor and victim cells may be changed according to fabricating or operating conditions of the non-volatile memory device.

Figure 4:
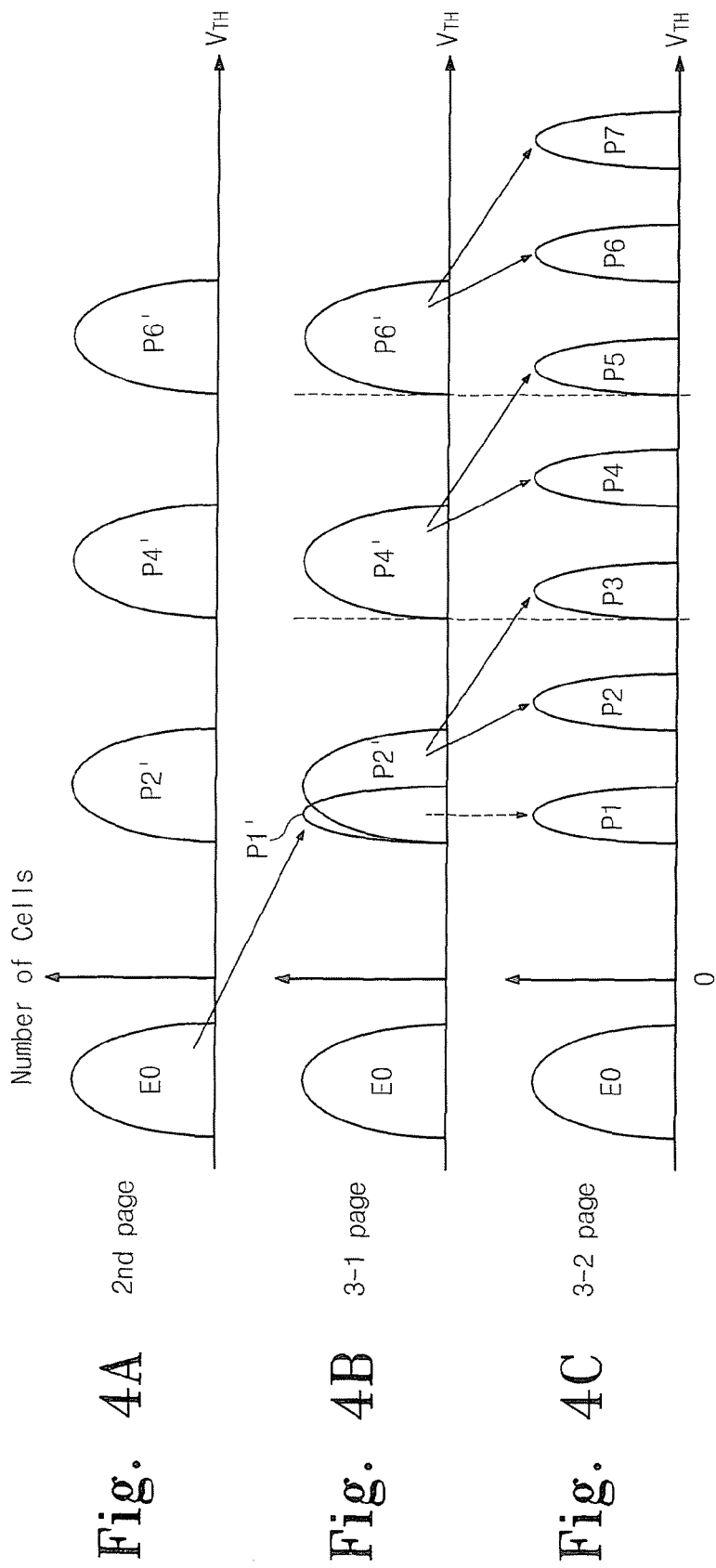
FIGS. 4A to 4C show variations of threshold voltage distributions according to a program process described in FIG. 3.

FIGS. 4A to 4C show variations of threshold voltage distributions according to a program process described in FIG. 3. In FIGS. 4A to 4C, there are illustrated program operations where a memory cell to be programmed to a program state P1 from an erase state E0 is classified into an aggressor cell.

FIG. 4A shows that the second page is programmed in selected memory cells. By an initial read operation, there may be detected threshold voltage states of selected memory cells programmed by the second page. That is, it is possible to judge whether a threshold voltage of each of the selected memory cells corresponds to any one of a plurality of states E0, P2', P4', and P6'. If a threshold voltage of a selected memory cell detected via the initial read operation corresponds to the erase state E0 and a data bit, loaded on a page buffer 230 so as to be programmed in the selected memory cell, is logically '0', the selected memory cell may be judged to be an aggressor cell to be programmed to a state P1. In this case, the selected memory cell may have a threshold voltage corresponding to the program state P1 after programming of the nth page is completed. By the initial read operation, there is made classification into aggressor and victim cells. Herein, the aggressor cells are programmed to the program state P1 from the erase state E0, and the victim cells are programmed to remaining target states P2 to P7.

FIG. 4B shows that the third page is programmed. In particular, in FIG. 4B, there is illustrated a process of programming aggressor cells inflicting the most influence to adjacent memory cells. That is, the most coupling may be caused due to a memory cell, to be programmed to the program state P1 from the erase state E0, among memory cells in which the third page is programmed. Among data bits constituting the third page, data bits corresponding to such aggressor cells are firstly programmed. The aggressor cells may be programmed to the program state P1' from the erase state E0.

FIG. 4C shows programming of rest cells excepting the aggressor cells. The rest cells are all memory cells of selected memory cells excepting the aggressor cells. That is, the rest cells include victim cells affected by the aggressor cells and non-victim cells not adjacent to the aggressor cells. The rest cells may be programmed to program states P2, P3, P4, P5, P6, and P7 from program states P2', P4', and P6' at the same time. Alternatively, among the rest cells, memory cells may be firstly programmed which are to be programmed to the program states P4, P5, P6, and P7 from the program states P4' and P6'. Subsequently, among the victim cells, memory cells can be programmed which are to be programmed to the program states P2 and P3 from the program state P2'. Alternatively, the rest cells are able to be programmed via a separate program operation with respect to each of the program states P2, P3, P4, P5, P6, and P7.

Programming of the rest cells may be changed variously. Only, while the rest cells are being programmed, the aggressor cells to be programmed to the program state P1 may be program inhibited. As a result, the coupling effect or overall physical influence due to the aggressor cells may be compensated by programming of victim and non-victim cells illustrated in FIG. 4C.

Figure 5:
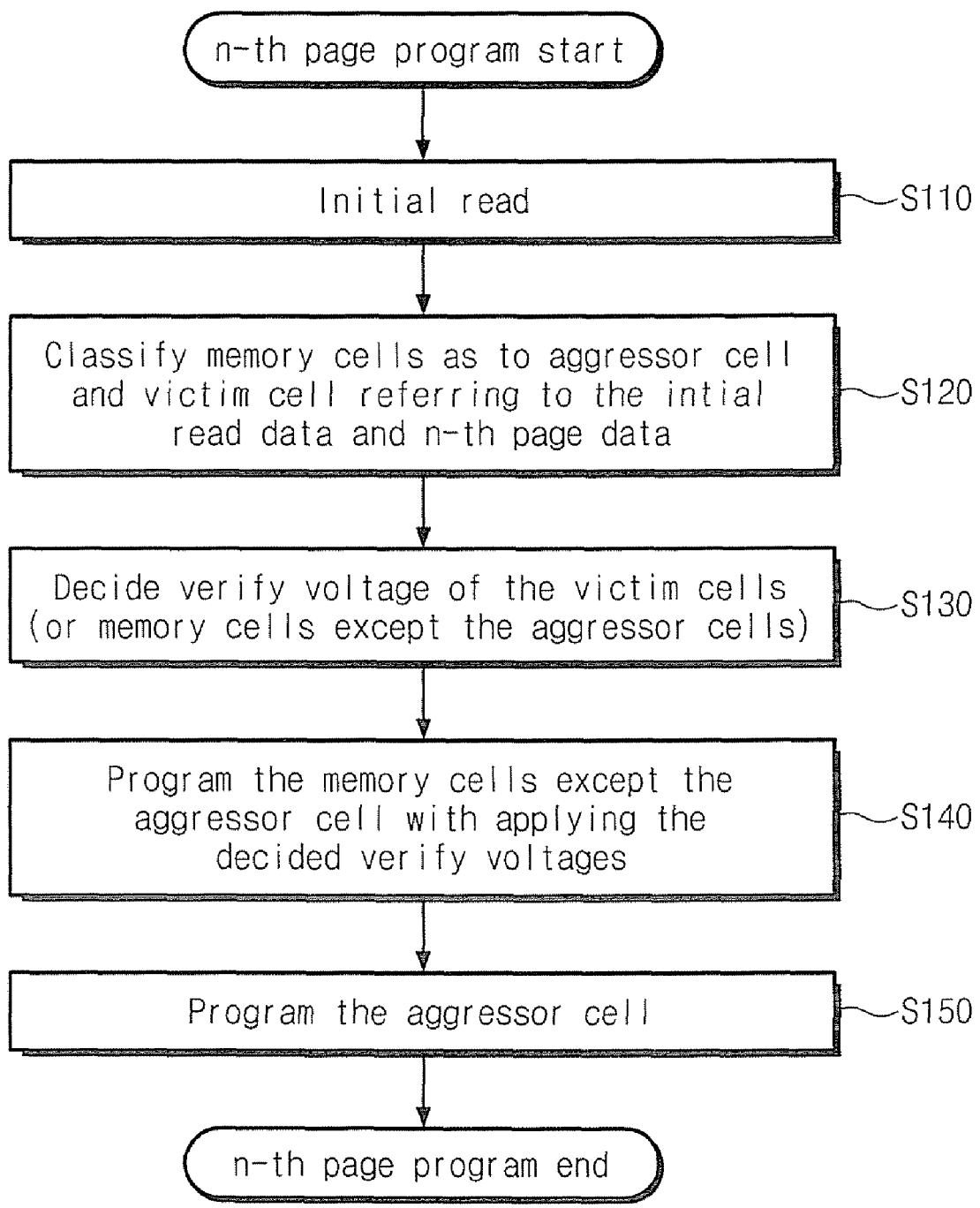
FIG. 5 is a flowchart showing a program process according to another embodiment of the present invention.

FIG. 5 is a flowchart showing a program process according to the second embodiment of the present invention. Below, there will be described a program process where memory cells to be programmed by one page data are classified into victim cells and aggressor cells and programming for the classified cells is made.

If data to be programmed in selected memory cells is all loaded on a page buffer 230, a program operation of the nth page commences. In step S110, an initial read operation is performed. In particular, a page buffer 230 senses selected memory cells via bit lines to store previously programmed data of the nth page. If a page to be programmed currently is the third page, as the previously programmed data, the first and second page data may be stored in the page buffer 230 (or, in latches of the page buffer 230) by the initial read operation.

If the initial read operation is completed, in step S120, control logic 250 classifies memory cells to be programmed by the nth page data into aggressor and victim cells, based on data latched by the initial read operation. The above-described classification process differentiates according to a program process. Herein, it is assumed that memory cells the threshold voltages of which are largely varied by programming are memory cells to be programmed to a program state. In this case, memory cells adjacent to such memory cells may experience the most coupling effect. The control logic 250 classifies a memory cell to be programmed to a program state from an erase state into an aggressor cell and a memory cell adjacent to the aggressor cell into a victim cell. In the event that memory cells placed at both sides of the victim cell all are memory cells to be programmed to a program state from an erase state, the victim cell may undergo the most coupling effect. The control logic 250 is able to classify the above-described coupling effect according to sizes by comparing the nth page data to be programmed with the initially read data. The control logic 250 divides selected memory cells into the aggressor and victim cells according to the coupling effect.

The control logic 250 determines a verification voltage Vfyn' for rest memory cells excepting victim or aggressor cells, in step S130. That is, a lower voltage than a verification voltage corresponding to a target state is allotted to aggressor cells and adjacent memory cells (victim cells) as a verification voltage. On the other hand, since cells (non-victim cells) being far from the aggressor cells are not affected (or, hardly affected) by the aggressor cells, a verification voltage corresponding to a target state may be allotted to the non-victim cells. But, it is understood that a lower voltage than a verification voltage corresponding to a target state is assigned to the non-victim cells in consideration of the relatively puny physical influence.

After a verification voltage is assigned with respect to rest memory cells excepting aggressor cells, in step S140, the rest memory cells may be programmed under the control of the control logic 250. In particular, victim cells adjacent to the aggressor cells may be programmed using a verification voltage which is lower than a verification voltage used for programming to a target state. The victim cells may have threshold voltages corresponding to their target states after the aggressor cells are programmed.

After imperfect programming is completed with respect to non-victim cells not adjacent to the victim or aggressor cells, in step S150, a program operation is performed with respect to aggressor cells causing the physical influence (for example, the coupling effect or program disturbance) on the non-victim cells. As described above, the aggressor cells are memory cells which are to be programmed to the program state P1 from the erase state E0. After the aggressor cells are programmed, there is completed a program operation of the nth page among multi-bit data.

In accordance with the above program process, there is described a scheme in which the negative physical influence of aggressor cells is changed into the positive influence to complete programming of victim cells. Further, it is understood that there is selectively made an operation for improving the distribution by reprogramming perfectly programmed non-victim cells with a higher verification voltage after programming of aggressor cells is completed. Accordingly, it is possible to prevent errors due to the physical influence between selected memory cells in which one page data is programmed.

Figure 6:
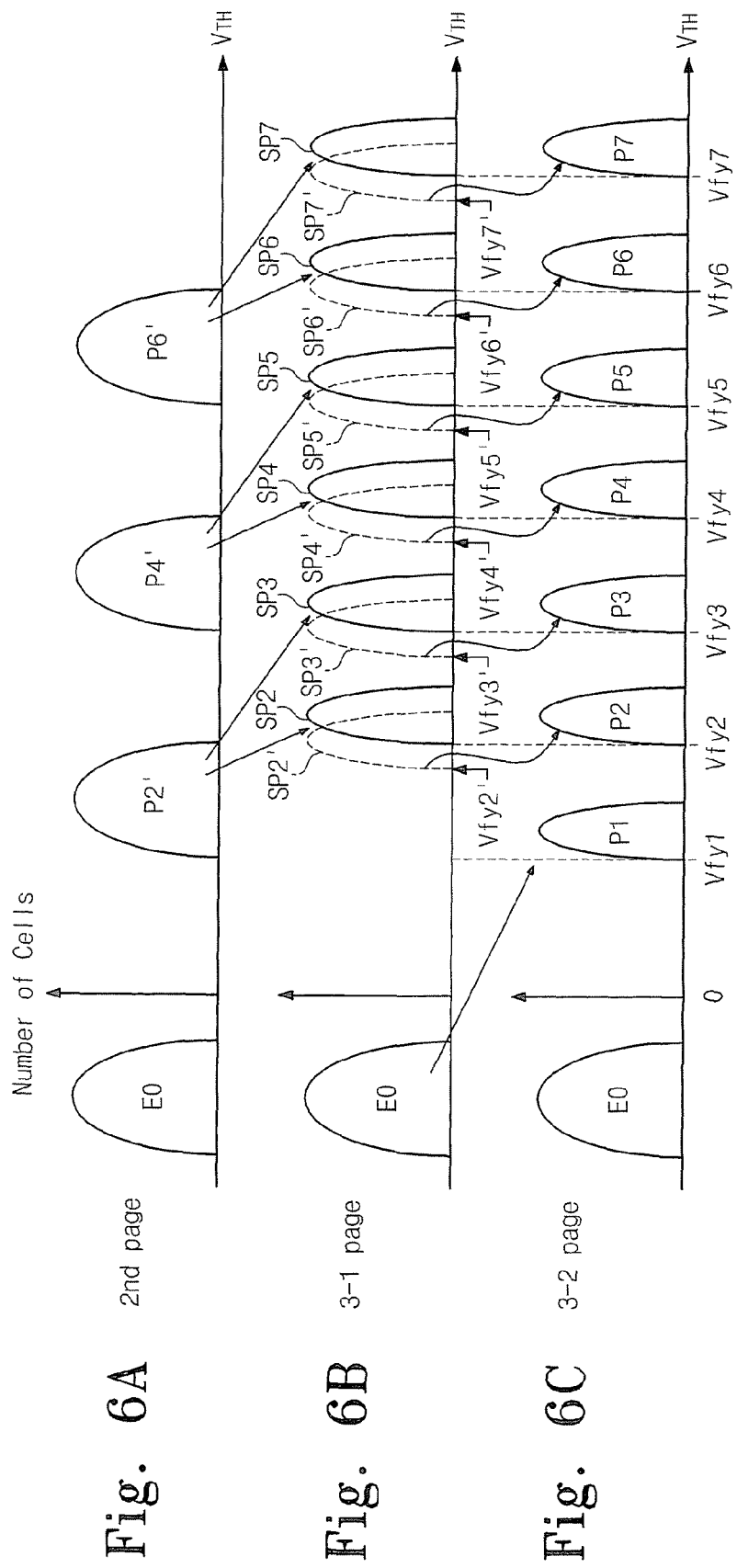
FIGS. 6A to 6C show variations of threshold voltage distributions according to a program process described in FIG. 5.

FIGS. 6A to 6C are diagrams showing a program process in FIG. 5. In FIGS. 6A to 6C, there is illustrated a program operation for the case where a memory cell to be programmed to a program state P1 from an erase state E0 is classified into an aggressor cell.

FIG. 6A shows that the second page is programmed. By an initial read operation, there may be detected threshold voltage states of selected memory cells programmed by the second page. That is, it is possible to judge whether a threshold voltage of each of the selected memory cells corresponds to any one of a plurality of states E0, P2', P4', and P6'. If a selected memory cell detected via the initial read operation is at the erase state E0 and a data bit to be programmed in the selected memory cell is logically '0', the selected memory cell may be judged to be an aggressor cell to be programmed to a state P1. In this case, the selected memory cell may have a threshold voltage corresponding to the program state P1 after programming of the third page is completed. By the initial read operation, there is made classification into aggressor cells and victim cells. Herein, the aggressor cells are programmed to the program state P1 from the erase state E0, and the victim cells are programmed to remaining target states P2 to P7.

FIGS. 6B and 6C are diagrams for describing a program operation of the third page. In particular, FIG. 6B shows a program process for rest cells excepting aggressor cells (cells programmed to P1 from E0). Victim cells are memory cells which are largely affected at programming of the aggressor cells. On the other hand, non-victim cells are memory cells which are hardly affected by the aggressor cells. In a case where rest cells are programmed, the non-victim cells may be programmed using verification voltages Vfy2, Vfy3, Vfy4, Vfy5, Vfy6, and Vfy7 corresponding to target states, respectively. On the other hand, in consideration of the physical influence by the aggressor cells, the victim cells may be programmed using verification voltages Vfy2', Vfy3', Vfy4', Vfy5', Vfy6', and Vfy7' which are lower than the verification voltages Vfy2, Vfy3, Vfy4, Vfy5, Vfy6, and Vfy7 corresponding to target states, respectively.

Memory cells having threshold voltages in the program state P2' of the second page may be programmed to have one of distributions SP2, SP2', SP3, and SP3' according to bit values of the third page. Whether the memory cells have threshold voltages in the program state P2' of the second page is judged by the initial read operation. Victim cells corresponding to the program state P2' may be programmed to have a distribution SP2' or SP3' according to bit values of the third page. In this case, the victim cells corresponding to the program state P2' may be supplied with a verification voltage Vfy2' or Vfy3'. Non-victim cells corresponding to the program state P2' may be programmed to have a distribution SP2 or SP3 according to bit values of the third page. In this case, the non-victim cells corresponding to the program state P2' may be supplied with a verification voltage Vfy2 or Vfy3.

Memory cells having threshold voltages in the program state P4' of the second page may be programmed to have one of distributions SP3, SP3', SP4, and SP4' according to bit values of the third page. Whether the memory cells have threshold voltages in the program state P4' of the second page is judged by the initial read operation. Victim cells corresponding to the program state P4' may be programmed to have a distribution SP3' or SP4' according to bit values of the third page. In this case, the victim cells corresponding to the program state P4' may be supplied with a verification voltage Vfy4' or Vfy5'. Non-victim cells corresponding to the program state P4' may be programmed to have a distribution SP4 or SP5 according to bit values of the third page. In this case, the non-victim cells corresponding to the program state P4' may be supplied with a verification voltage Vfy4 or Vfy5.

Memory cells having threshold voltages in the program state P6' of the second page may be programmed to have one of distributions SP6, SP6', SP7, and SP7'according to bit values of the third page. Whether the memory cells have threshold voltages in the program state P6' of the second page is judged by the initial read operation. Victim cells corresponding to the program state P6' may be programmed to have a distribution SP6' or SP7' according to bit values of the third page. In this case, the victim cells corresponding to the program state P6' may be supplied with a verification voltage Vfy6' or Vfy7'. Non-victim cells corresponding to the program state P6' may be programmed to have a distribution SP6 or SP7 according to bit values of the third page. In this case, the non-victim cells corresponding to the program state P6' may be supplied with a verification voltage Vfy6 or Vfy7.

In exemplary embodiments, unlike a program process of rest cells described in FIG. 6B, all of the rest cells may be programmed at the same time. Alternatively, a program operation may be executed sequentially with respect to program states P2', P4' and P6' according to a result of the initial read operation, respectively. For example, there are firstly programmed memory cells in an upper state. Alternatively, target states are divided into groups, and the rest cells are programmed by a group unit. For example, memory cells corresponding to the program states P4' and P6' in one group are firstly programmed, and then memory cells corresponding to the program state P2' in another group are programmed. Herein, the verification voltages Vfy2' to Vfy7' may be determined based on the physical influence of victim cells caused by programming of the aggressor cells. The verification voltages are determined using such an example that one victim pattern is compensated. But, it is possible to determine the number of verification voltages according to types of aggressor cells, types of victim cell patterns, precision of compensation, and the like. Further, the verification voltages are able to be extracted by testing or numerical calculation.

If programming of the rest cells is ended, as illustrated in FIG. 6C, the aggressor cells may be programmed. In memory cells programmed by the third page, the most coupling effect may be caused by a memory cell whose threshold voltage is shifted to the program state P1 from the erase state E0. Accordingly, victim cells programmed according to low verification voltages may form target states P2, P3, P4, P5, P6, and P7 since they undergo the coupling or physical influence when the aggressor cells are programmed.

As a result, the coupling or overall physical influence may enable an imperfect program operation of rest cells to be compensated. In other words, it is possible to take advantage of the physical influence on victim cells due to aggressor cells.

FIGS. 7A to 7C and 8A to 8C are diagrams for describing a program process which provides an effect opposite to the embodiment described in FIGS. 6A to 6C. As will be described below, programming may be completed according to the physical influence which memory cells to be programmed to rest states P2 to P7 inflict to memory cells to be programmed to a target state P1.

Figure 7:
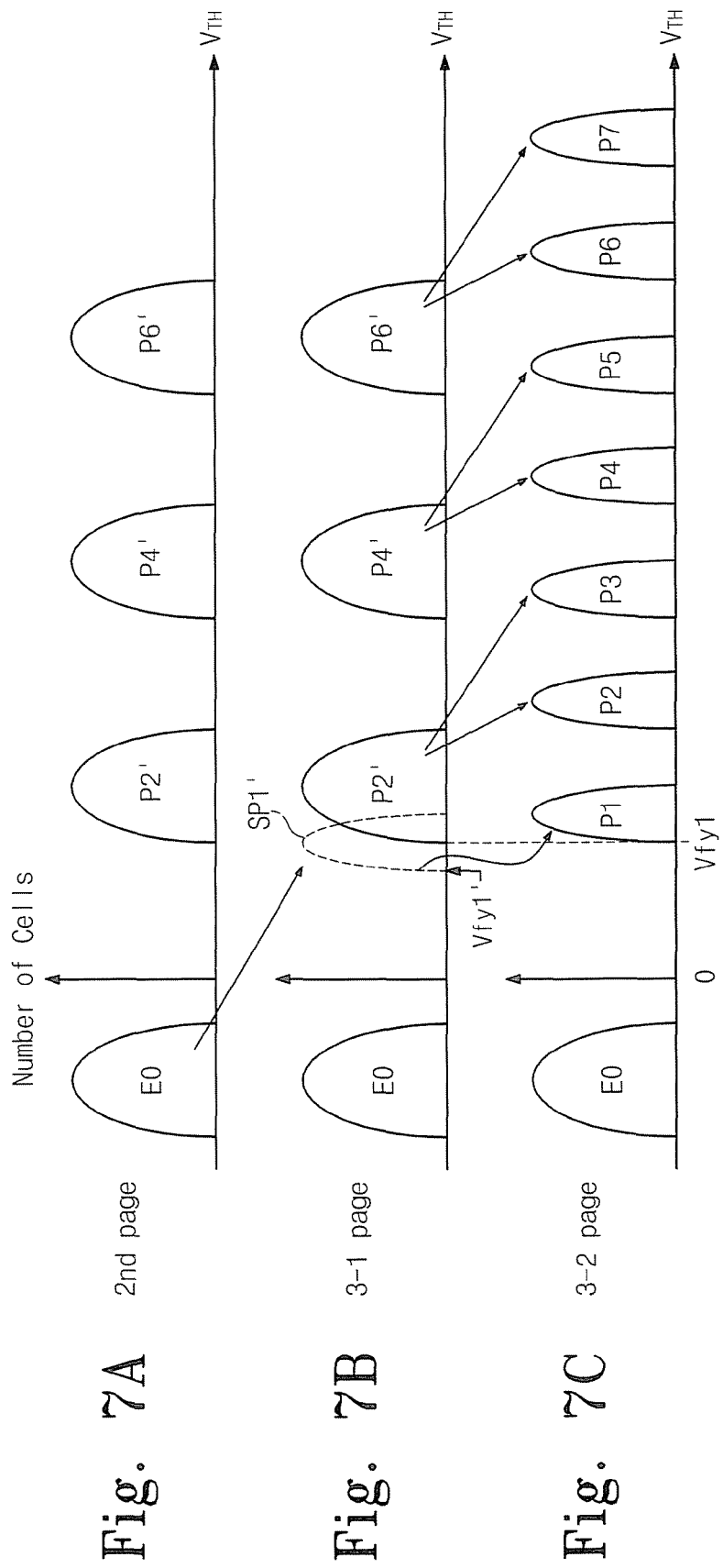
FIGS. 7A to 7C show variations of threshold voltage distributions according to still another embodiment of a program process described in FIG. 5.

Referring to FIGS. 7A to 7C, there may be described a modified embodiment where a program operation is completed according to the physical influence which aggressor cells experiences when victim cells are programmed.

In FIG. 7A, there are illustrated distributions after the second page is programmed. By an initial read operation, there may be detected threshold voltage states of selected memory cells programmed by the second page. That is, it is possible to judge whether a threshold voltage of each of the selected memory cells corresponds to any one of a plurality of states E0, P2', P4', and P6'. If a threshold voltage of a selected memory cell detected via the initial read operation corresponds to the erase state E0 and a data bit, to be programmed in the selected memory cell and loaded on a page buffer 230, is logically '0', the selected memory cell may be judged to be an aggressor cell to be programmed to a state P1. In this case, the selected memory cell may have a threshold voltage corresponding to the program state P1 after programming of the third page is completed. By the initial read operation, there is made classification on aggressor cells and victim cells. Herein, the aggressor cells are memory cells to be programmed to the program state P1 from the erase state E0, and the victim cells are to be programmed to target states P2 to P7.

FIGS. 7B and 7C show program operations of the third page sequentially. In particular, FIG. 7B shows a program process for aggressor cells. Among memory cells to be programmed by the third page, aggressor cells whose threshold voltages are shifted to the program state P1 from the erase state E0 may cause the most coupling effect. The aggressor cells may be programmed using a verification voltage Vfy1' which is lower than a verification voltage of a target state. The aggressor cells programmed according to the verification voltage Vfy1' may form a distribution SP1'. At this time, victim cells may undergo the coupling or physical influence which is caused when the aggressor cells are programmed. But, variation of threshold voltages of the victim cells due to the physical influence may be compensated by a subsequent program operation for rest cells.

In FIG. 7C, there are illustrated threshold voltage distributions of selected memory cells which are formed according to a program operation of rest cells including non-victim cells and victim cells. By programming of the rest cells, threshold voltages of the aggressor cells programmed to the imperfect program state SP1' may be shifted to the target state P1 according to the physical influence caused by the victim cells. That is, it is understood that imperfect programming of the aggressor cells is accomplished according to the physical influence caused by the victim cells. This means that roles of the aggressor and victim cells are switched unlike the embodiment described in FIGS. 6A to 6C.

Figure 8:
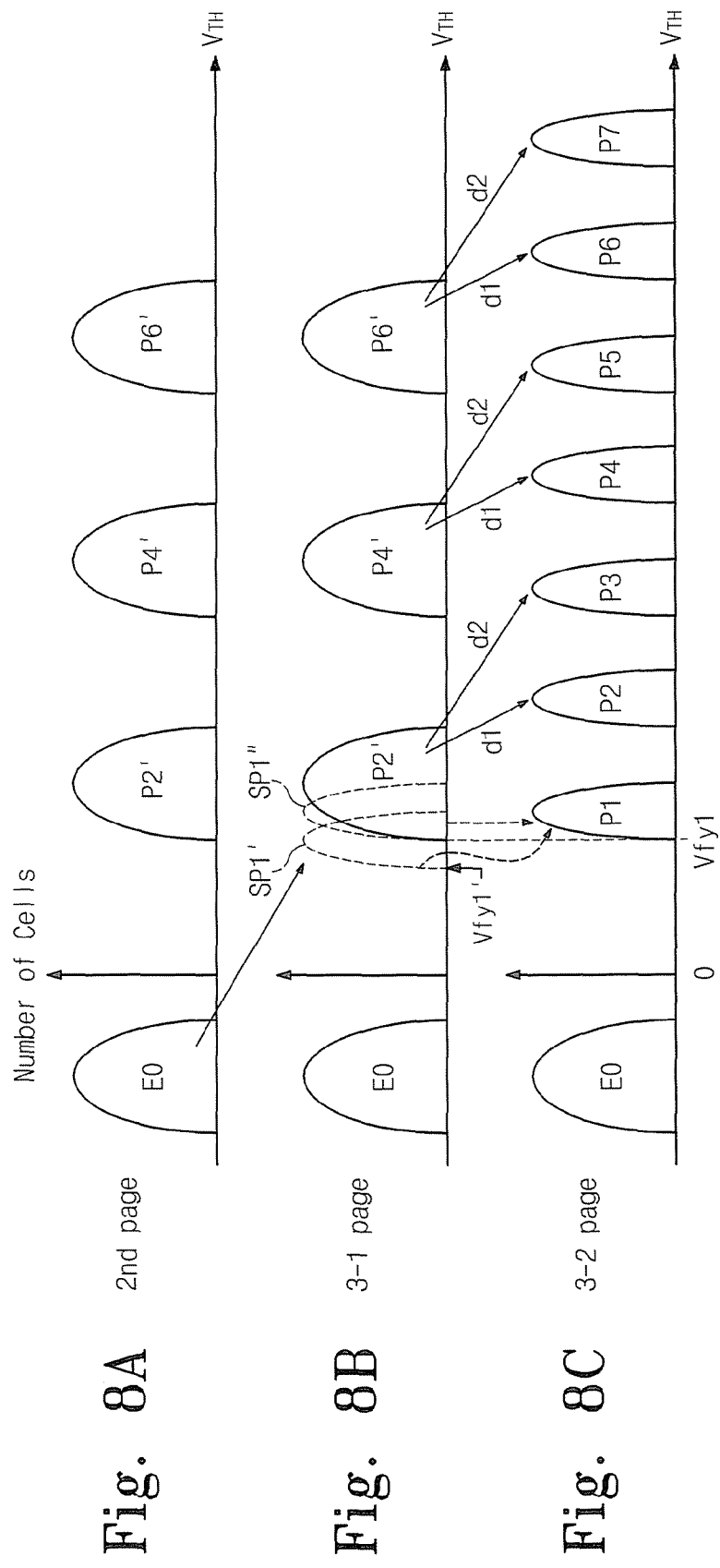
FIGS. 8A to 8C show variations of threshold voltage distributions according to still another embodiment of a program process described in FIG. 5.

In FIGS. 8A to 8C, there is illustrated a program process where aggressor cells are divided into two groups to be programmed by a group unit. Below, there will be described a modified embodiment where a program operation is completed based on the physical influence which the aggressor cells experience according to division of program operations for victim cells.

Referring to FIG. 8A which shows threshold voltage distributions after the second page is programmed, by an initial read operation, there may be detected threshold voltage states of selected memory cells programmed by the second page. That is, it is possible to judge whether a threshold voltage of each of the selected memory cells corresponds to any one of a plurality of states E0, P2', P4', and P6'. If a threshold voltage of a selected memory cell detected via the initial read operation corresponds to the erase state E0 and a data bit, to be programmed in the selected memory cell and loaded on a page buffer 230, is logically '0', the selected memory cell may be judged to be an aggressor cell to be programmed to a state P1. In this case, the selected memory cell may have a threshold voltage corresponding to the program state P1 after programming of the third page is completed.

If a threshold voltage of a selected memory cell detected via the initial read operation corresponds to any one of the states P2', P4', and P6' and a data bit, to be programmed in the selected memory cell and loaded on a page buffer 230, is logically '0', the selected memory cell may have one of states P3, P5, and P7 after the third page is programmed. In this case, a shift distance of a threshold voltage of the selected memory cell may be marked by d2. That is, although the physical influence caused by the selected memory cell is less than that caused by a memory cell programmed to the state P1, the selected memory cell may affect peripheral cells relatively much as compared with memory cells programmed to program states P2, P4, and P6. Threshold voltages of the memory cells programmed to the program states P2, P4, and P6 may be shifted by a shift distance d1.

Accordingly, memory cells to be programmed to the states P3, P5, and P7 may be judged to be an aggressor cell. By the initial read operation, there is made classification for aggressor cells to be programmed to the program state P1 from the erase state E0, aggressor cells to be programmed to the target states P3, P5, and P7, and rest cells to be programmed to target states P2, P4, and P6.

A program process of the third page is sequentially illustrated in FIGS. 8B and 8C. In particular, in FIG. 8B, there is illustrated a program process for aggressor cells having a target state. A verification voltage Vfy1 may be used to program cells, which are predicted to experience the physical influence due to the victim cells a few, among the aggressor cells. Aggressor cells programmed according to the verification voltage Vfy1 may form a distribution SP1", and aggressor cells programmed according to the verification voltage Vfy1' may form a distribution SP1'. At this time, victim cells may experience the coupling or physical influence caused when the aggressor cells are programmed. But, variation of threshold voltages of the victim cells due to the physical influence may be compensated by a subsequent program operation for rest cells.

In FIG. 8C, there are illustrated threshold voltage distributions of selected memory cells which are formed according to a program operation of rest cells including non-victim cells and victim cells. By programming of the rest cells, threshold voltages of the aggressor cells programmed to the imperfect program states SP1' and SP1' may be shifted to the target state P1 according to the physical influence caused by the victim cells. That is, it is understood that imperfect programming of the aggressor cells is completed according to the physical influence caused by the victim cells.

Figure 9:
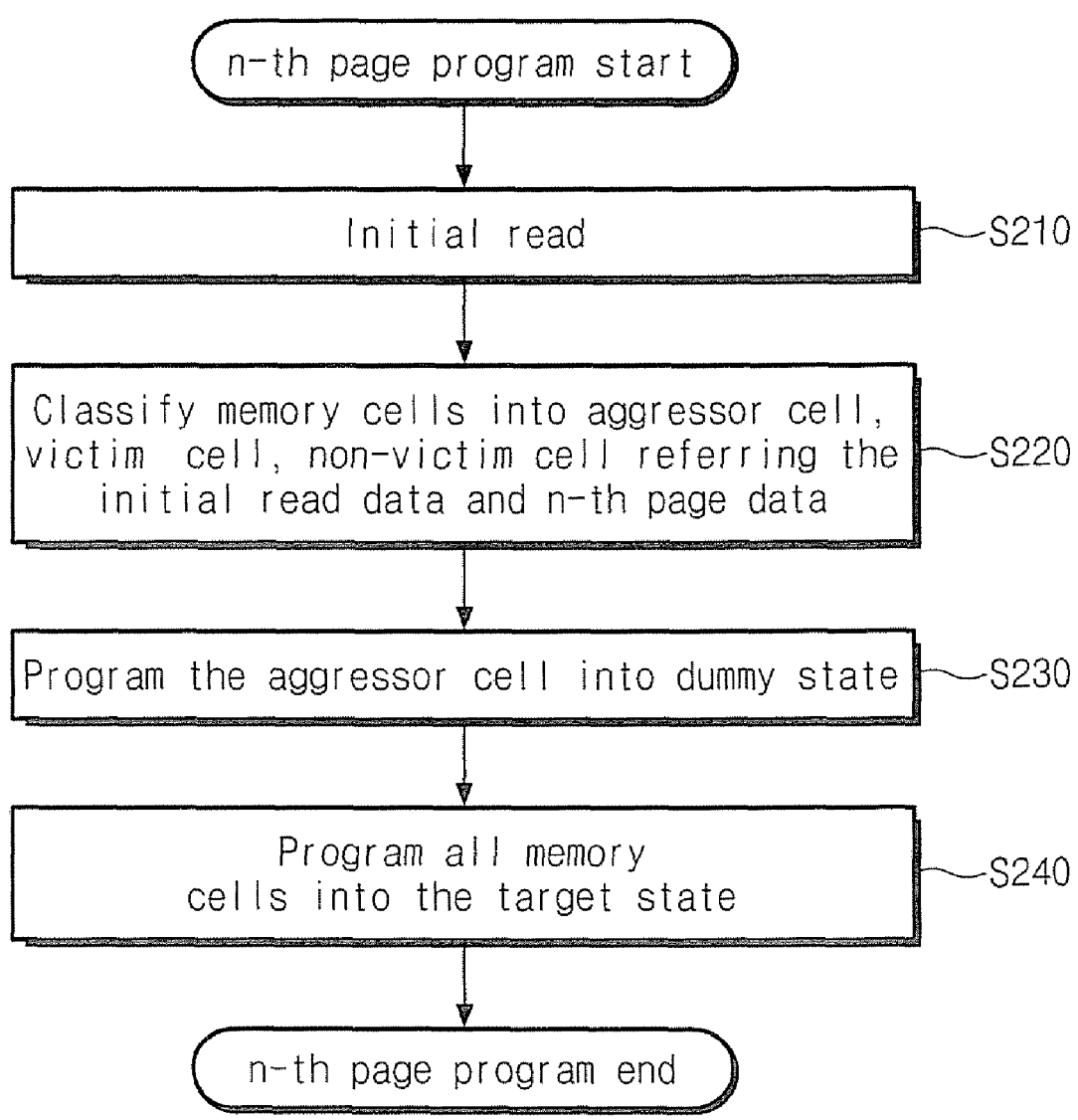
FIG. 9 is a flowchart showing a program process according to still another embodiment of the present invention.

FIG. 9 is a flowchart showing a program process of the nth page according to another embodiment of the present invention. Referring to FIG. 9, memory cells in which one page data is programmed may be classified into aggressor cells and rest cells, and memory cells classified into the aggressor cells may be programmed to have a dummy state DST. This will be more fully described below.

If loading of program data on a page buffer 230 is completed, a program sequence for the nth page may commence. In step S210, the page buffer 230 executes an initial read operation where previously programmed data of the nth page is sensed via bit lines of selected memory cells of a cell array 210. If a page to be programmed is the third page, data of the second and third pages may be stored in latches of the page buffer 230 according to the initial read operation.

If the initial read operation is completed, in step S220, control logic 250 classifies memory cells to be programmed by the nth page data into aggressor and victim cells, based on data latched by the initial read operation. The above-described classification may be made differently according to a program process. Herein, it is assumed that memory cells with threshold voltages largely varied by programming are memory cells to be programmed to a program state. In this case, memory cells adjacent to such memory cells may experience the most coupling effect. The control logic 250 classifies a memory cell to be programmed to a program state from an erase state into an aggressor cell and a memory cell adjacent to the aggressor cell into a victim cell. In the event that memory cells placed at both sides of the victim cell all are memory cells to be programmed to a program state from an erase state, the victim cell may undergo the most coupling effect. The control logic 250 is able to classify the above-described coupling effect into each size by comparing the nth page data to be programmed with the initially read data. The control logic 250 is able to classify memory cells into aggressor, victim, and non-victim cells according to the coupling effect.

In subsequent step S230, the control logic 250 controls a voltage generator 260 and a page buffer 230 such that aggressor cells of the selected memory cells are programmed to have a dummy state DST. The dummy state SDT corresponds to a threshold voltage level lower than a target state to which the aggressor cells are programmed. That is, a verification voltage Vfy_DS lower than the target state P1 may be used to program the aggressor cells to the dummy state DST. The dummy state DST indicates a temporary state before programming to the target state P1 to reduce threshold voltage variation. The programming to the dummy state DST may include a process where a given number of program pulses are applied to the aggressor cells to be programmed. Alternatively, the programming to the dummy state DST may include applying a program pulse until there are programmed all or a part of memory cells to be programmed from a verification level identical to or lower than a conventional verification voltage Vfy1. That is, a process of programming cells to the dummy state is not limited to this disclosure, but changed variously. As the aggressor cells are programmed to have the dummy state DST, victim cells may undergo the coupling or physical influence relatively less than that caused by the aggressor cells programmed to have a threshold voltage distribution SP1, SP1' or SP1".

If the aggressor cells are programmed to have the dummy state DST, in step S240, there are programmed the selected memory cells including the aggressor cells, the victim cells, and the non-victim cells. Threshold voltages of the aggressor cells may be shifted to the program state P1 from the dummy state DST. A threshold voltage variation from the dummy state DST to the program state P1 is relatively less than that from the erase state E0 to the program state P1. Accordingly, no aggressor cells inflict the physical influence (for example, the coupling effect) to adjacent cells. A process of programming all of the selected memory cells may be changed variously. For example, programming to upper target states P4, P5, P6, and P7 is firstly executed before programming to lower target states E0, P1, P2, and P3 is executed. Alternatively, it is possible to execute programming to all target states individually or simultaneously.

As understood from the above description, it is possible to minimize the physical influence due to aggressor cells by the program process including programming of aggressor cells to the dummy state DST. The programming of aggressor cells to the dummy state DST may be made within a program process for programming one page data.

FIGS. 10A to 10C and 11A to 11C show variations of threshold voltage distributions according to a program process described in FIG. 9. In FIGS. 10A to 10C and 11A to 11C, there are illustrated exemplary embodiments where after aggressor cells are programmed to have a dummy state DST, they are programmed together with rest cells. First of all, programming of aggressor cells to a dummy state DST will be described with reference to FIGS. 10A to 10C.

Figure 10:
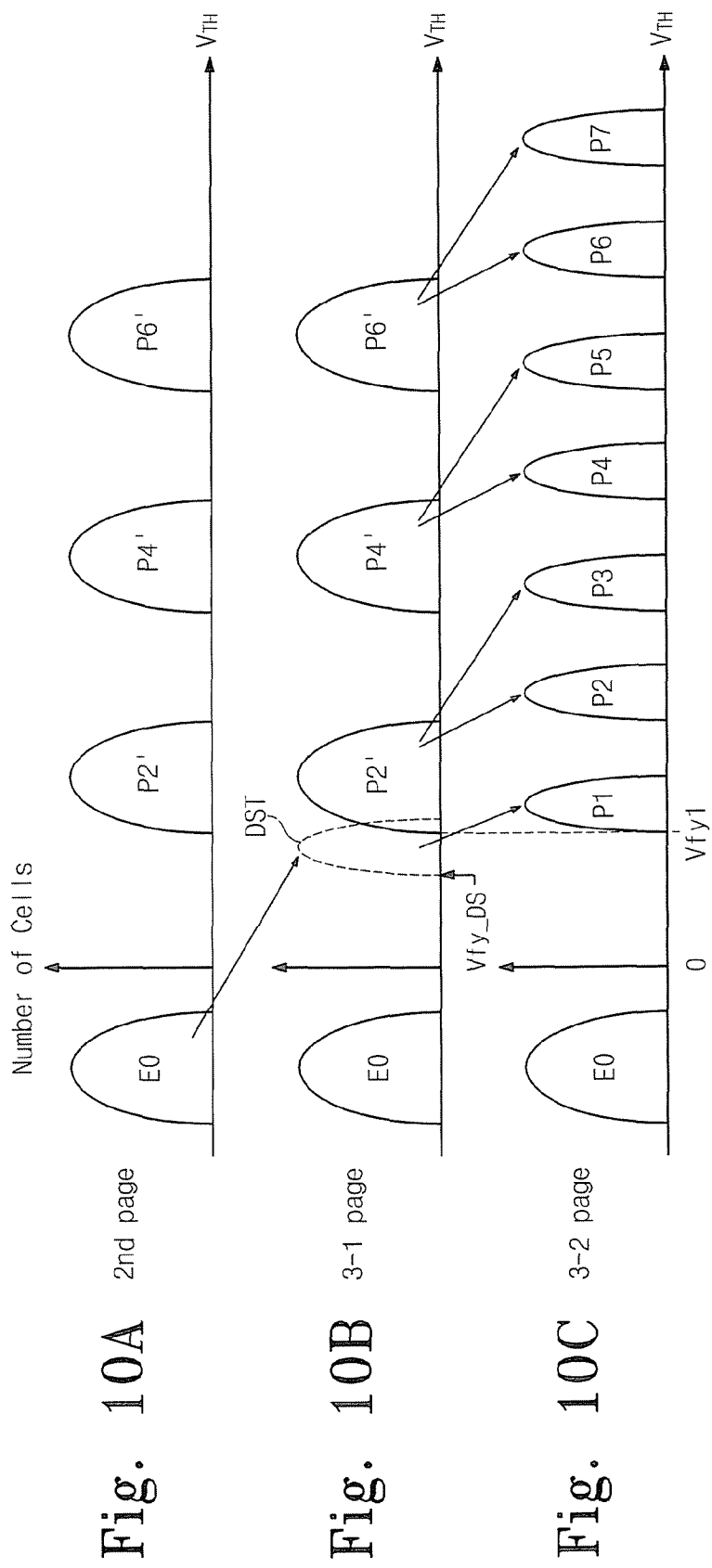
FIGS. 10 to 15 shows program processes according to other embodiments of the present invention.

In FIG. 10A, there are illustrated threshold voltage distributions after the second page is programmed. By an initial read operation, there may be detected threshold voltage states of selected memory cells programmed by the second page. That is, it is possible to judge whether a threshold voltage of each of the selected memory cells corresponds to any one of a plurality of states E0, P2', P4', and P6'. If a threshold voltage of a selected memory cell detected via the initial read operation corresponds to the erase state E0 and a data bit, to be programmed in the selected memory cell and loaded on a page buffer 230, is logically '0', the selected memory cell may be judged to be an aggressor cell to be programmed to a state P1. In this case, the selected memory cell may have a threshold voltage corresponding to the program state P1 after programming of the third page is completed. By the initial read operation, there is made classification into aggressor cells and victim cells. Herein, the aggressor cells are programmed to the program state P1 from the erase state E0, and the victim cells are programmed to remaining target states P2 to P7.

A program process of the third page is sequentially illustrated in FIGS. 10B and 10C. In particular, in FIG. 10B, there is illustrated a program process where aggressor cells are programmed to a dummy state DST. Among memory cells in which the third page is programmed, aggressor cells may cause the most coupling effect. As described above, the aggressor cells are memory cells which are to be programmed to have a program state P1. The aggressor cells are programmed to have the dummy state DST using a verification voltage Vfy_DS. The aggressor cells programmed according to the verification voltage Vfy_DS may form a distribution DST. At this time, victim cells may experience the coupling effect or the physical influence which is caused when the aggressor cells are programmed. Threshold voltage variation of the victim cells due to such physical influence may be compensated by subsequent programming of rest cells.

In FIG. 10C, there is illustrated a program operation for aggressor, victim, and non-victim cells. The aggressor cells are programmed to the program state P1 from a dummy state DST. Each of the victim or non-victim cells may be programmed from states P2', P4', and P6' to target states P2, P3, P4, P5, P6, and P7 as illustrated in FIG. 10C. The aggressor cells are shifted to the target state P1 from the dummy state DST. In this case, the aggressor cells may be supplied with a verification voltage Vfy1.

In case of programming selected memory cells (including aggressor, victim, and non-victim cells), programming to upper target states P4, P5, P6, and P7 is firstly executed before programming to lower target states E0, P1, P2, and P3 is executed. Alternatively, it is possible to perform a program operation independently with respect to all target states. Alternatively, it is possible to perform a program operation simultaneously with respect to target state groups.

Figure 11:
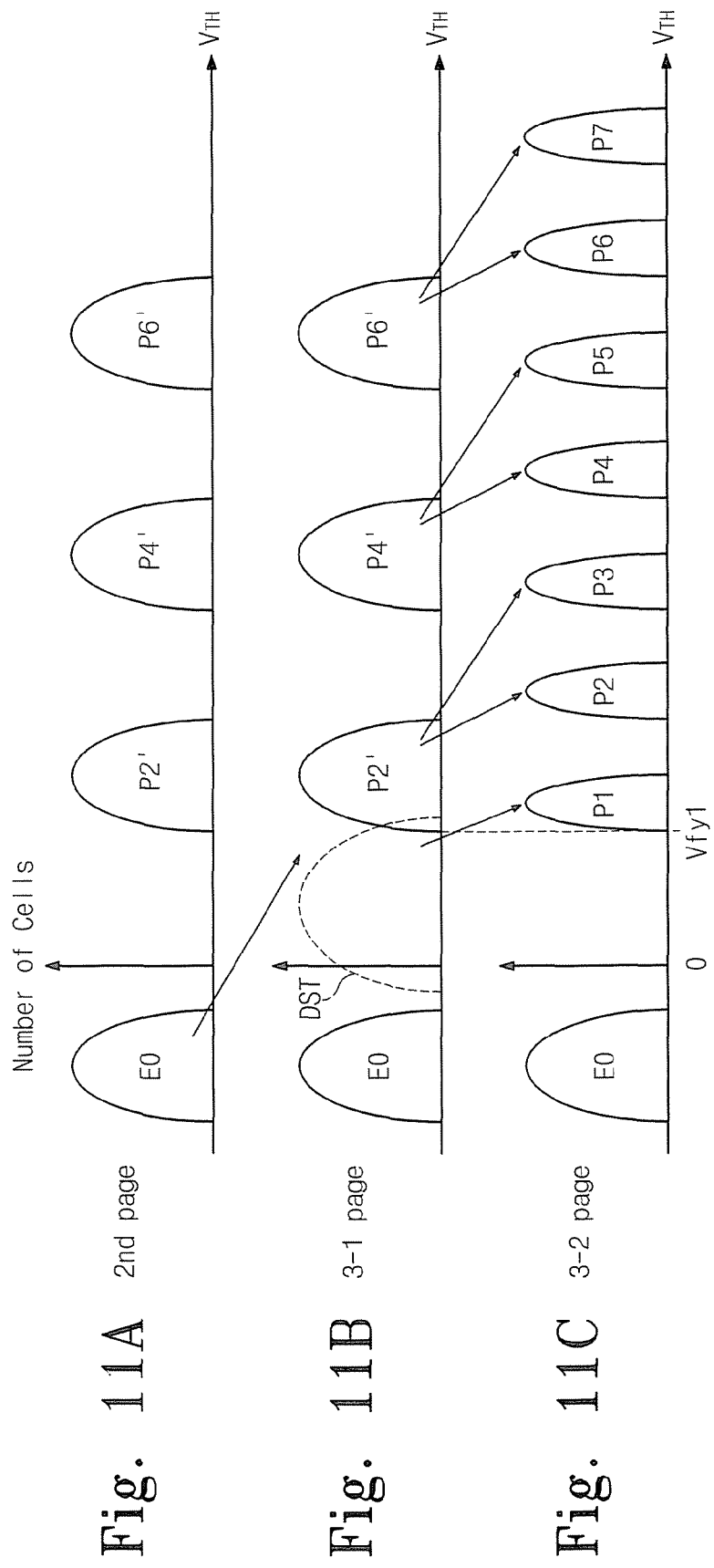

FIGS. 11A to 11C show a program process according to another embodiment. A program process may be identical to that in FIGS. 10A to 10C excepting a range of a dummy state DST. The dummy state DST indicates all states where aggressor cells are temporarily programmed to escape sharp threshold voltage variation. The programming to the dummy state DST may be accomplished by a process where a given number of program pulses are applied to the aggressor cells to be programmed to the state P1. Alternatively, the programming to the dummy state DST may include applying a program pulse until there are programmed all or a part of memory cells to be programmed by a verification level identical to or lower than a conventional verification voltage Vfy1.

FIGS. 12A to 12D and 13A to 13D are diagrams for describing program processes according to other embodiments of the present invention. Memory cells to be programmed to a program state P1 and memory cells to be programmed to a program state P7 are selected as aggressor cells. In particular, aggressor cells to be programmed to the program state P7 may cause the physical influence by program disturbance although they are not adjacent directly to victim or non-victim cells. That is, the memory cells to be programmed to the program state P7 may affect memory cells to be programmed to a lower program state among memory cells in a selected page.

First of all, referring to FIGS. 12A to 12D, there will be described an operation of classifying aggressor cells into memory cells to be programmed to a program state P1 and memory cells to be programmed to a program state P7.

Figure 12:
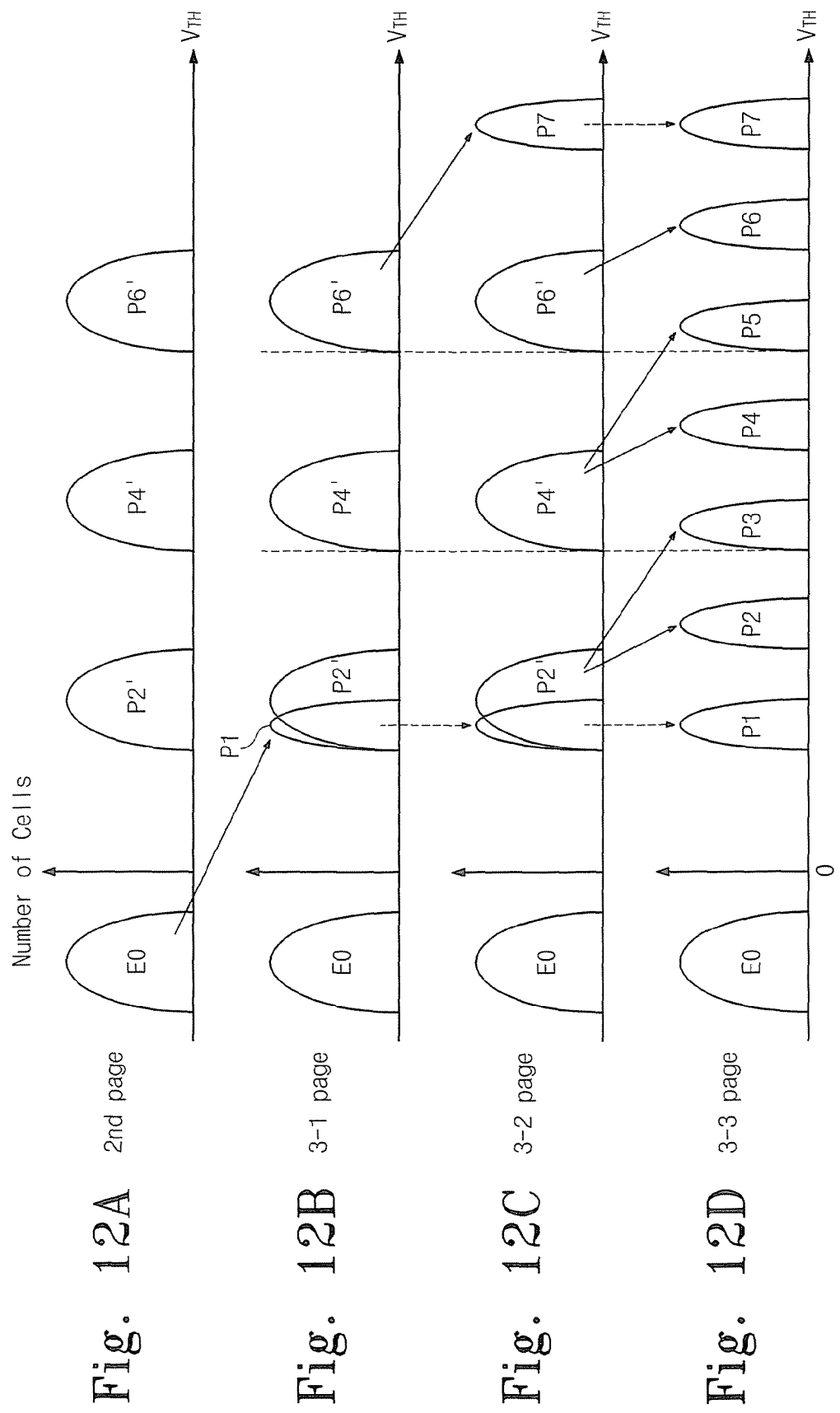
Figure 13:
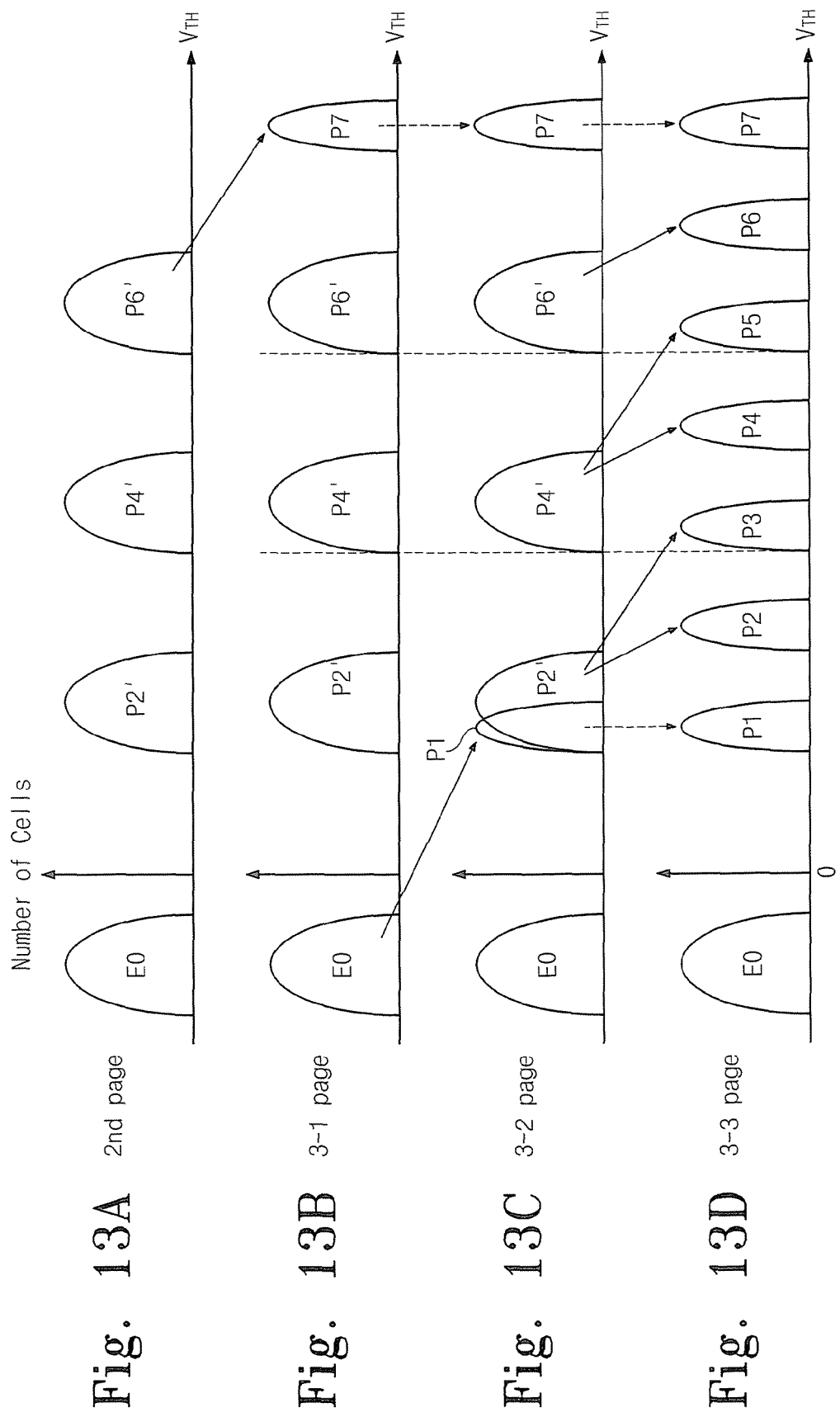

FIG. 12A shows threshold voltage distributions after the second page is programmed. By an initial read operation, there may be detected threshold voltage states of selected memory cells programmed by the second page. That is, it is possible to judge whether a threshold voltage of each of the selected memory cells corresponds to any one of a plurality of states E0, P2', P4', and P6'. If a threshold voltage of a selected memory cell detected via the initial read operation corresponds to the erase state E0 and a data bit, to be programmed in the selected memory cell and loaded on a page buffer 230, is logically '0', the selected memory cell may be judged to be an aggressor cell to be programmed to a state P1. Further, if a threshold voltage of a selected memory cell detected via the initial read operation corresponds to a program state P6' and a data bit to be programmed is logically '0', the selected memory cell may be judged to be an aggressor cell to be programmed to a state P7. In this case, the aggressor cells may have threshold voltages corresponding to the program states P1 and P7 after programming of the third page is completed.

In FIG. 12B, there is illustrated a diagram for describing a program operation for aggressor cells to be programmed to the program state P1. In FIG. 12C, there is illustrated a diagram for describing a program operation for aggressor cells to be programmed to the program state P7. FIG. 12D shows a diagram for describing a program operation for memory cells excepting the aggressor cells.

Victim or non-victim cells may be programmed from states P2', P4' and P6' to target states P2, P3, P4, P5, and P6, respectively. Programming of memory cells excepting the aggressor cells is able to be changed variously. For example, victim or non-victim cells are divided into a plurality of groups according to target states, and a program operation may be performed in a group unit. Alternatively, it is possible to perform a program operation individually with respect to target states P2, P3, P4, P5, and P6.

Referring to FIGS. 13A to 13D, there is illustrated an exemplary embodiment where aggressor cells are programmed in the order different from FIGS. 12A to 12D. As understood from FIGS. 13A to 13D, aggressor cells to be programmed to a program state P7 are firstly programmed, and aggressor cells to be programmed to a program state P1 are secondly programmed. These program steps are illustrated in FIGS. 13B and 13C. In FIG. 13D, there is illustrated a program process for memory cells excepting the aggressor cells. A program process in FIGS. 13A to 13D is substantially identical to that in FIGS. 12A to 12D.

Figure 14:
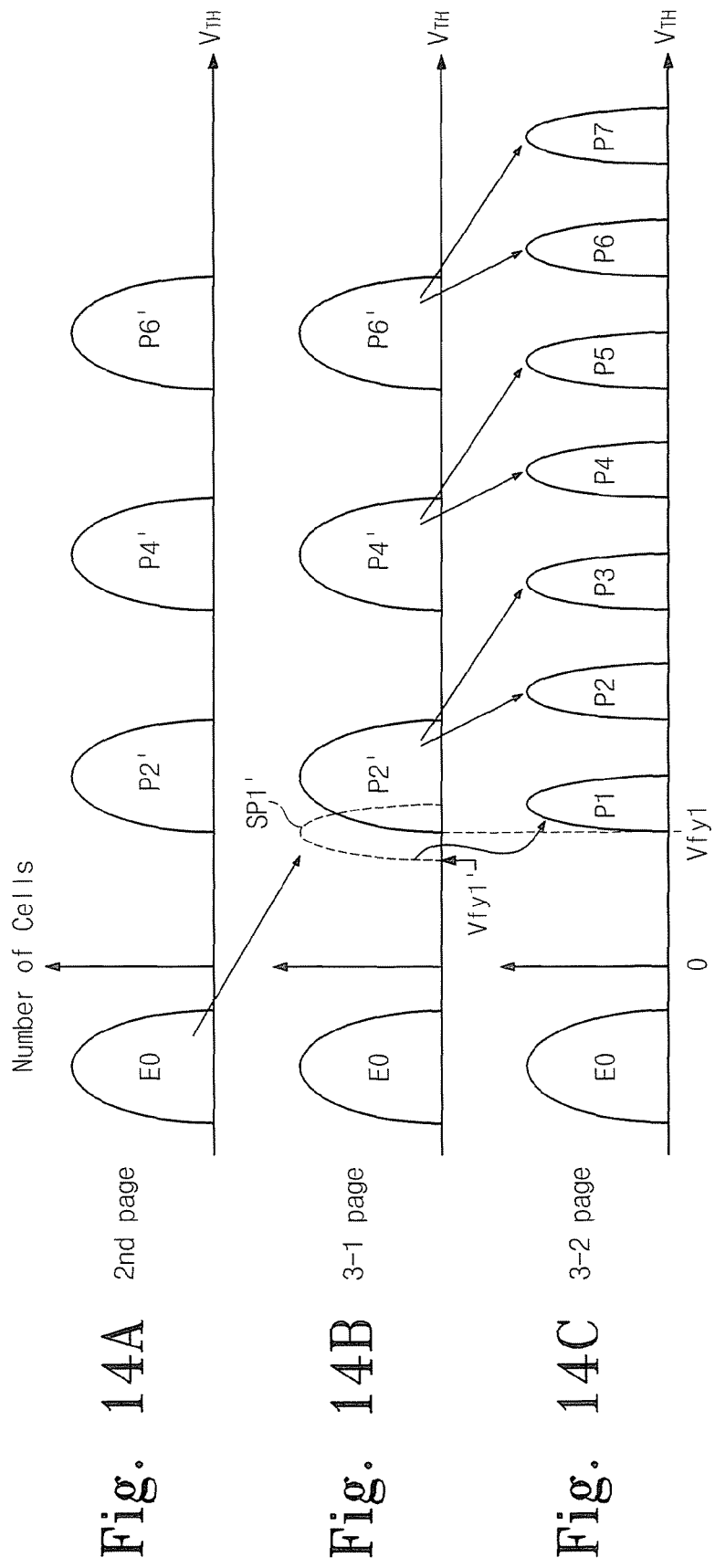

FIGS. 14A to 14C show a program process according to other embodiment of the present invention. Referring to FIGS. 14A to 14C, a verification voltage for aggressor cells to be programmed to a program state P1 is determined based on program disturbance due to aggressor cells to be programmed to a program state P7.

FIG. 14A shows program states of the second page detected via an initial read operation. FIG. 14B shows a program operation for aggressor cells to be programmed to a program state P1. The aggressor cells to be programmed to a program state P1 may be programmed using a verification voltage Vfy1' which is determined based on program disturbance due to aggressor cells to be programmed to a program state P7.

In FIG. 14C, there is illustrated a program process for rest memory cells excepting the aggressor cells to be programmed to the program state P1. By the program process illustrated in FIG. 14C, the program disturbance caused by the aggressor cells to be programmed to the program state P7 may be compensated by imperfect programming of the aggressor cells to be programmed to the program state P1.

Figure 15:
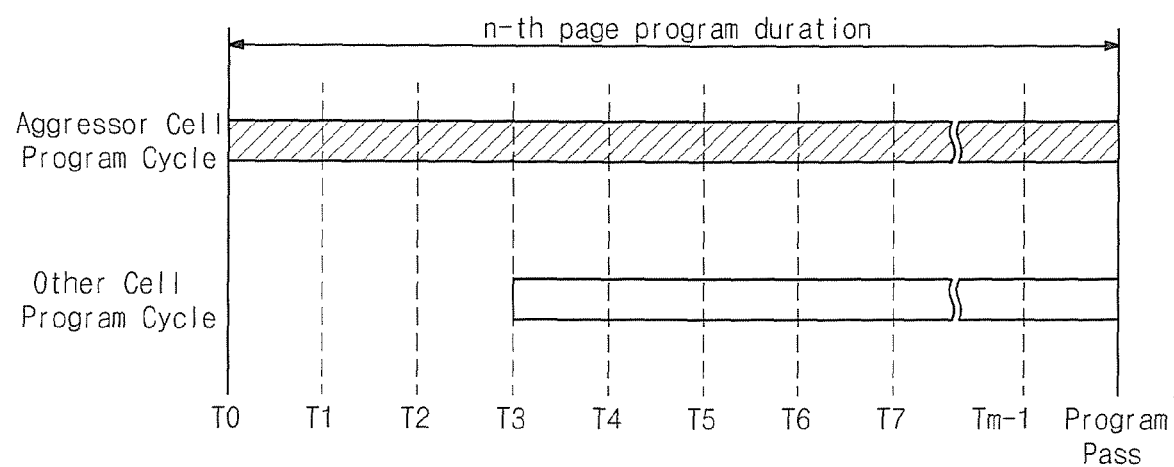

FIG. 15 shows a program process according to still another embodiment of the present invention. Referring to FIG. 15, during the same program cycle, it is possible to compensate physical influence of aggressor cells by firstly allotting a program start time for aggressor cells prior to that for non-aggressor cells. As illustrated in FIG. 15, at a page program operation, aggressor cells are programmed prior to non-aggressor cells. That is, a program loop of the aggressor cells commences at T0. On the other hand, a program loop of non-aggressor cells commences at T3. The physical influence such as the coupling or program disturbance of aggressor cells may be compensated at a program operation of non-aggressor cells which are programmed relatively late as compared to the aggressor cells.

Figure 16:
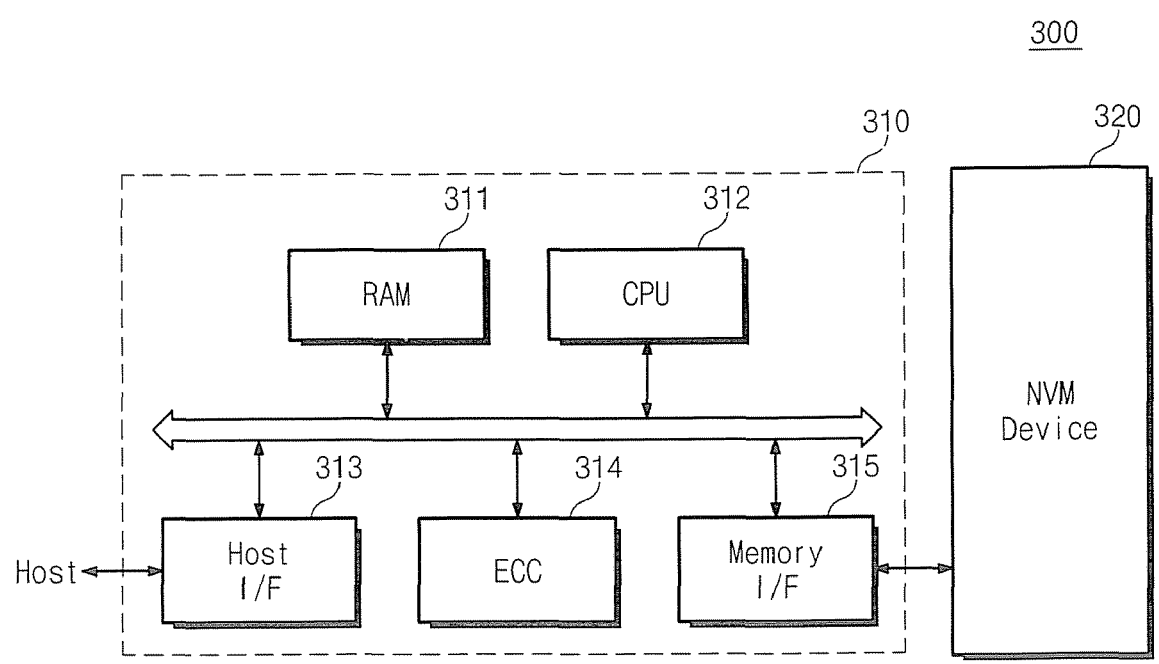
FIG. 16 is a block diagram showing a memory system according to the present invention.

FIG. 16 is a block diagram showing a memory system according to the present invention. Referring to FIG. 16, a memory system 300 according to the present invention includes a non-volatile memory device 320 and a memory controller 310.

The non-volatile memory device 320 may be formed of a flash memory device which has a cell array 100 illustrated in FIG. 1. The memory controller 310 may be configured to control the non-volatile memory device 320. It is understood that the non-volatile memory device 320 and the memory controller 310 are configured to form a memory card or a Solid State Drive/Disk (SSD). RAM 311 (including SRAM) is used as a work buffer memory of a processing unit 312. A host interface 313 includes a protocol for exchanging data with a host connected with the memory system 300.

An ECC block 314 is configured to detect and correct errors of data read out from the non-volatile memory device 320. A memory interface 314 is configured to interface with the non-volatile memory device 320 according to the present invention. The processing unit 312 is configured to control an overall operation (e.g., data exchange) of the memory controller 310. Although not shown in FIG. 16, the memory system 300 according to the present invention may further comprise ROM which stores code data for interfacing with the host. The non-volatile memory device 320 may be formed of a multi-chip package having a plurality of flash memory chips.

The memory system 300 may be used as a storage media which has the high reliability, that is, whose error rate is low. In particular, a flash memory device of the present invention is able to be applied to a memory system such as the SSD. In this case, the memory controller 310 may be configured to communicate with an external (for example, a host) via one of various interface protocols such as USB, MMC, PCI-E, SATA, PATA, SCSI, ESDI, IDE, and the like.

Herein, the memory controller 310 may access the non-volatile memory device 320 in the same manner as described according to the above embodiments. That is, it is possible to select a verification voltage for victim cells by acquiring data for aggressor cells at a program operation.

At a read operation, victim cells are classified into sub-distributions according to a coupling size with reference to data of aggressor cells. An optimum read level may be selected to discriminate classified sub-distributions, respectively. Further, it is possible to determine an optimized read level according to an interval read method for reducing an error rate. Herein, characteristics obtained from maker and serial numbers, process parameters, disturbance, retention, program-erase cycling, pilot cells, etc. may be provided to the memory controller 310 to estimate the coupling or retention characteristics more accurately.

Figure 17:
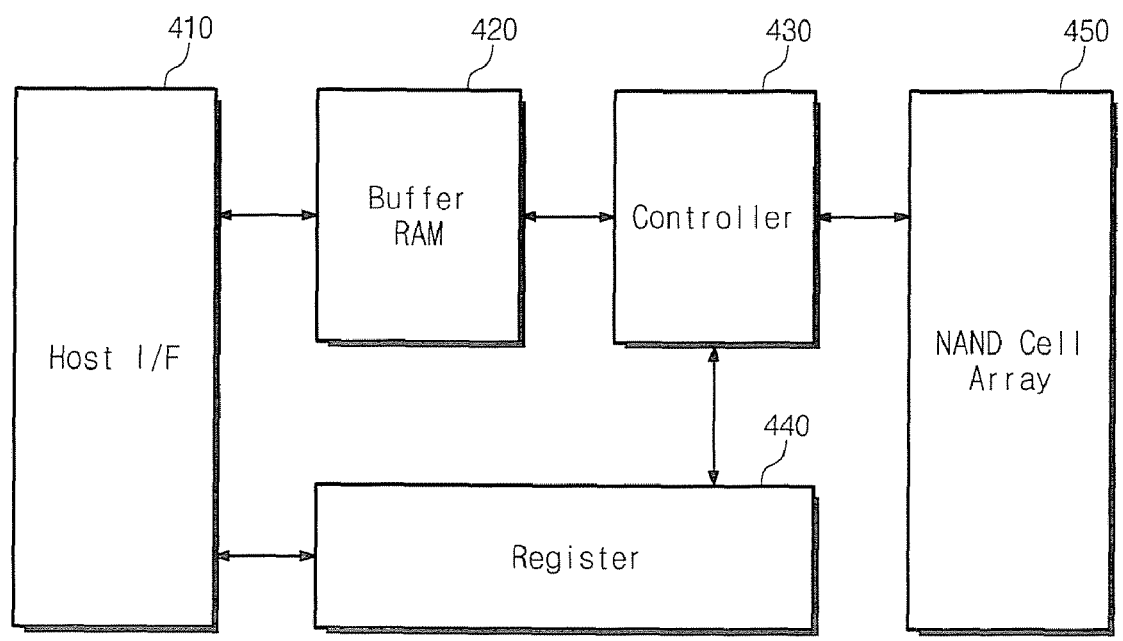
FIG. 17 is a block diagram showing a fusion memory device according to the present invention.

FIG. 17 is a block diagram showing a fusion memory or a fusion memory system 400 performing a program operation according to embodiments of the present invention. For example, technical characteristics of the present invention may be applied to an One_NAND flash memory device 400 as a fusion memory device.

The One_NAND flash memory device 400 may include a host interface 410 for exchanging various information with a device which uses a protocol different from each other; a buffer RAM 420 for storing a code for driving a memory device or to temporarily store data; a control part 430 for controlling reading, programming, and overall states in response to control signals and commands from the external; a register 440 for storing commands, addresses, and data related with configuration for defining a system operating circumstance of the memory device; and a NAND flash cell array 450 configured to include non-volatile memory cells and a page buffer. The One_NAND flash memory device responds to a write request from a host to write data in the NAND flash cell array 450 according to program processes of the present invention in order to prevent the physical influence of aggressor cells.

Figure 18:
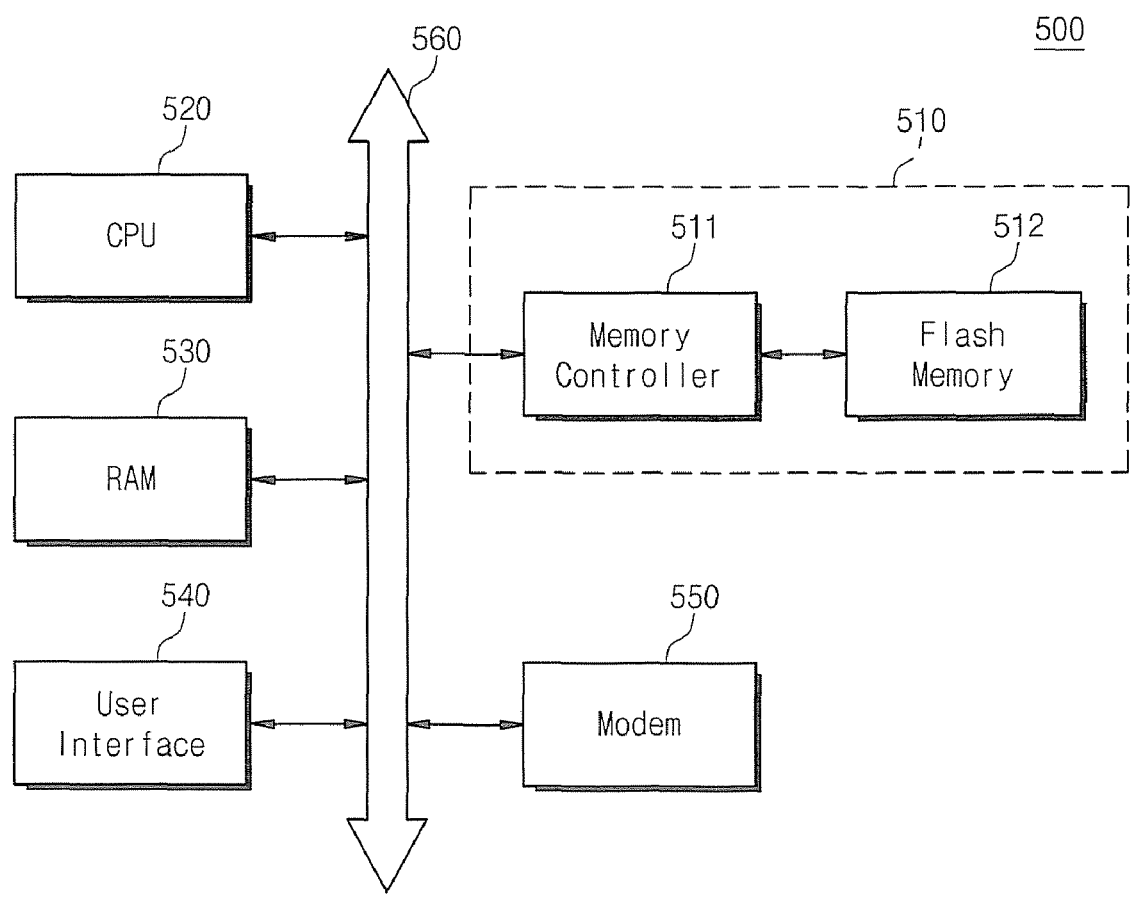
FIG. 18 is a block diagram showing the configuration of a computing system according to the present invention.

FIG. 18 is a block diagram showing a computing system 500 including a flash memory device 512 according to the present invention.

Referring to FIG. 18, a computing system 500 includes a processing unit 520 such as a microprocessor or a CPU, RAM 530, a user interface 540, a modem such as a baseband chipset, a memory system 510 which are electrically connected with a system bus 560. The memory system 510 may be configured substantially identically to that illustrated in FIG. 13 or 14. In the event that the computing system 500 is a mobile device, a battery (not shown) may be further provided to supply an operating voltage of the computing system 500. Although not shown in FIG. 18, it is understood that the computing system 500 further comprises an application chipset, a camera image processor (CIS), a mobile DRAM, and the like. The memory system 510 may be formed of, for example, a Solid State Drive/Disk (SSD) which uses non-volatile memories to store data. Further, the memory system 510 may be formed of a fusion flash memory (for example, an One_NAND flash memory).

The computing system 500 may provide the high reliability of data via the memory system 510 by analyzing characteristics of distributions based on acquired index data and classifying the distributions according to the magnitude of physical influence, such as the coupling effect, by which threshold voltages are shifted. The analyzing and classifying may be made by the memory system 510. Alternatively, the analyzing and classifying may be accomplished according to the control of the microprocessor 520 of the computing system 500. Alternatively, the analyzing and classifying may be partially allotted to the memory system 510 and the microprocessor 520 to utilize resources effectively.

A flash memory device and/or a memory controller according to the present invention may be packed by various types of packages. For example, the flash memory device and/or the memory controller according to the present invention may be packed by one selected from a group of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of programming a non-volatile memory device, comprising:
    programming a row of M-bit non-volatile memory cells in the non-volatile memory device with respective first bits of data associated with a page of data, where M is an integer greater than one;
    classifying a first plurality of the M-bit non-volatile memory cells in the row as aggressor cells and a second plurality of the M-bit non-volatile memory cells in the row as victim cells by identifying as aggressor cells those M-bit non-volatile memory cells in the row that remain erased after said programming the row with the first bits of data, but are to be programmed with respective second bits of data associated with an additional page of data; and
    programming the aggressor cells with the respective second bits of data associated with the additional page of data in advance of programming the victim cells with the respective second bits of data associated with the additional page of data.

2. A method of programming a nonvolatile memory device, comprising:
    writing at least one page of data into the nonvolatile memory device by programming a first plurality of M-bit nonvolatile memory cells in a row of the nonvolatile memory device from an equivalent erased state to respective programmed states by increasing threshold voltages of the first plurality of M-bit nonvolatile memory cells to positive voltage levels, where M is an integer greater than one; then
    identifying a second plurality of M-bit nonvolatile memory cells in the row of the nonvolatile memory device as aggressor cells having threshold voltages associated with the erased state; and
    writing an additional page of data into the nonvolatile memory device by programming the aggressor cells with respective bits of data from the additional page of data before programming any of the first plurality of M-bit nonvolatile memory cells in the row of the nonvolatile memory device with respective bits of data from the additional page or vice versa.

3. The method of claim 2, wherein said writing at least one page of data is followed by and said identifying a second plurality of M-bit nonvolatile memory cells is preceded by reading data from the row of the nonvolatile memory device into latches.

4. The method of claim 2, wherein M=3; and wherein said writing at least one page of data into the nonvolatile memory device comprises writing first and second pages of data into the nonvolatile memory device by sequentially programming the first plurality of M-bit nonvolatile memory cells in the row of the nonvolatile memory device with respective data from the first page of data and respective data from the second page of data.

5. The method of claim 2, wherein said writing an additional page of data into the nonvolatile memory device comprises partially programming the first plurality of M-bit nonvolatile memory cells in the row of the nonvolatile memory device with respective bits of data from the additional page of data before programming the aggressor cells with respective bits of data from the additional page of data; and wherein said programming the aggressor cells with respective bits of data from the additional page of data comprises further programming at least some of the first plurality of M-bit nonvolatile memory cells in the row of the nonvolatile memory device through coupling to the aggressor cells.

6. A method of programming a nonvolatile memory device, comprising:

programming a row of M-bit nonvolatile memory cells in the nonvolatile memory device with M−1 pages of data, where M is an integer greater than one;

identifying, as aggressor cells, those M-bit nonvolatile memory cells in the row that remain erased after the M−1 pages of data have been programmed into the row, but are to be programmed during an operation to further program the row with an Mth page of data; and then programming the row with the Mth page of data by programming all of the aggressor cells in the row with respective first bits of data from the Mth page of data in advance of further programming non-aggressor cells in the row, which were previously programmed with the M−1 pages of data, with respective second bits of data from the Mth page of data.

* * * * *